(12) United States Patent
Oshio et al.

(10) Patent No.: US 11,566,175 B2
(45) Date of Patent: Jan. 31, 2023

(54) WAVELENGTH CONVERTER AND METHOD FOR PRODUCING THEREOF, AND LIGHT EMITTING DEVICE USING THE WAVELENGTH CONVERTER

(71) Applicant: Panasonic Intellectual Property Management Co., Ltd., Osaka (JP)

(72) Inventors: Shozo Oshio, Osaka (JP); Takeshi Abe, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 478 days.

(21) Appl. No.: 16/619,148

(22) PCT Filed: May 1, 2018

(86) PCT No.: PCT/JP2018/017385
§ 371 (c)(1),
(2) Date: Dec. 4, 2019

(87) PCT Pub. No.: WO2018/225424
PCT Pub. Date: Dec. 13, 2018

(65) Prior Publication Data
US 2020/0144789 A1 May 7, 2020

(30) Foreign Application Priority Data

Jun. 6, 2017 (JP) .............................. JP2017-111512
Dec. 13, 2017 (JP) .............................. JP2017-238640

(51) Int. Cl.
*C09K 11/77* (2006.01)
*C09K 11/64* (2006.01)
(Continued)

(52) U.S. Cl.
CPC .......... *C09K 11/7774* (2013.01); *C09K 11/70* (2013.01); *C09K 11/77742* (2021.01);
(Continued)

(58) Field of Classification Search
CPC ............ C09K 11/7774; C09K 11/7721; C09K 11/7715; C09K 11/025; C09K 11/02;
(Continued)

(56) References Cited

U.S. PATENT DOCUMENTS

| 7,554,258 B2 | 6/2009 | Rossner |
| 10,364,963 B2 * | 7/2019 | Oshio .................. H01S 5/0087 |

(Continued)

FOREIGN PATENT DOCUMENTS

| JP | 2007-231105 A | 9/2007 |
| JP | 4621421 | 11/2010 |

(Continued)

OTHER PUBLICATIONS

Extended European Search Report for corresponding EP Application No. 18813351.6, dated May 12, 2020.
(Continued)

*Primary Examiner* — Matthew E. Hoban
*Assistant Examiner* — Lynne Edmondson
(74) *Attorney, Agent, or Firm* — Renner, Otto, Boisselle & Sklar, LLP

(57) ABSTRACT

A wavelength converter 100 includes: a first phosphor 1 composed of an inorganic phosphor activated by $Ce^{3+}$; and a second phosphor 2 composed of an inorganic phosphor activated by $Ce^{3+}$ and different from the first phosphor. At least one of the first phosphor and the second phosphor is particulate. The first phosphor and the second phosphor are bonded to each other by at least one of a chemical reaction in a contact portion between the compound that constitutes the first phosphor and a compound that constitutes the second phosphor and of adhesion between the compound that constitutes the first phosphor and the compound that constitutes the second phosphor.

17 Claims, 11 Drawing Sheets

(51) Int. Cl.
  *H01L 33/50* (2010.01)
  *H01L 33/22* (2010.01)
  *H01S 3/16* (2006.01)
  *C09K 11/70* (2006.01)
  *H01S 5/06* (2006.01)

(52) U.S. Cl.
  CPC ............ *H01L 33/22* (2013.01); *H01L 33/504* (2013.01); *H01S 5/0609* (2013.01)

(58) Field of Classification Search
  CPC ............... C09K 11/0883; C09K 11/08; C09K 11/7706; C09K 11/7769; C09K 11/7718; C09K 11/77742; C09K 11/646; C09K 11/77; H01L 33/504; H01L 33/505; H01L 33/501; H01L 33/22; H01S 3/1643; H01S 5/0609; C04B 2235/9653; C04B 35/115; C01P 2002/50; C01P 2004/61
  USPC ..................................... 252/301.4 F, 301.4 R
  See application file for complete search history.

(56) References Cited

U.S. PATENT DOCUMENTS

| | | | | |
|---|---|---|---|---|
| 10,669,479 | B2* | 6/2020 | Oshio | ..................... H01L 33/50 |
| 11,028,988 | B2* | 6/2021 | Yamanaka | ............. F21S 45/70 |
| 2004/0145308 | A1 | 7/2004 | Rossner | |
| 2008/0150412 | A1* | 6/2008 | Yoshimatsu | ....... C09K 11/0883 |
| | | | | 313/486 |
| 2010/0012964 | A1 | 1/2010 | Copic et al. | |
| 2011/0042617 | A1 | 2/2011 | Ootsubo | |
| 2011/0227477 | A1* | 9/2011 | Zhang | ................... C04B 35/638 |
| | | | | 313/503 |
| 2012/0075834 | A1 | 3/2012 | Wei et al. | |
| 2012/0139409 | A1 | 6/2012 | Kishimoto | |
| 2015/0299566 | A1* | 10/2015 | Kinoshita | ............ C09K 11/025 |
| | | | | 252/301.36 |
| 2017/0037313 | A1 | 2/2017 | Hirosaki | |
| 2017/0343188 | A1 | 11/2017 | Oshio | |

FOREIGN PATENT DOCUMENTS

| | | |
|---|---|---|
| JP | 2012-123940 | 6/2012 |
| WO | 2009/119668 A1 | 10/2009 |
| WO | 2015/080062 A1 | 6/2015 |
| WO | 2016/092743 A1 | 6/2016 |
| WO | 2016207380 A1 | 12/2016 |

OTHER PUBLICATIONS

International Search Report for corresponding Application No. PCT/JP2018/017385, dated Jul. 17, 2018.

International Written Opinion for corresponding Application No. PCT/JP2018/017385, dated Jul. 17, 2018.

* cited by examiner

WAVELENGTH CONVERTER AND METHOD FOR PRODUCING THEREOF, AND LIGHT EMITTING DEVICE USING THE WAVELENGTH CONVERTER

TECHNICAL FIELD

The present invention relates to a wavelength converter and a method for producing thereof, and to a light emitting device using the wavelength converter. More specifically, the present invention relates to a wavelength converter usable for a light emitting device including a solid-state light emitting element, and particularly a laser diode, and relates to a method for producing the wavelength converter, and relates to a light emitting device using the wavelength converter.

BACKGROUND ART

Heretofore, there has been known a light emitting device composed by combining a solid-state light emitting element and a wavelength converter including a phosphor with each other. As such a light emitting device as described above, for example, a white light emitting diode light source, a laser illuminator and a laser projector have been known.

In recent years, an output increase of such a light emitting device has been in progress, and as a result, a load on the phosphor has tended to increase year by year. Then, in order to improve durability of the phosphor, full mineralization of the wavelength converter including the phosphor has been progressing in recent years. As such a wavelength converter as described above, for example, a phosphor single crystal, translucent phosphor ceramics and a sintered body of phosphor have been proposed.

As a prior art using the translucent phosphor ceramics and the sintered body of the phosphor, a wavelength converter of Patent Literature 1 has been known. In Patent Literature 1, there is disclosed a wavelength converter in which a part or all of polycrystalline ceramics are converted to polycrystalline phosphor ceramics by diffusing an emission center such as $Ce^{3+}$ into a polycrystalline ceramic body serving as a base.

In Patent Literature 2, there is disclosed an illuminator including a laser light source that emits laser light, and a light emitting unit that includes a phosphor sintered body formed by sintering an oxynitride phosphor and emits fluorescence upon receiving the laser light emitted from the laser light source. Then, it is also disclosed that the phosphor sintered body includes a plurality of types of sintered bodies, each of which emits fluorescence with a color different from those of others, the sintered bodies being laminated on one another along an optical axis of the laser light.

Moreover, in Patent Literature 3, there is disclosed a wavelength converter composed by forming one particle by causing a phosphor A and a phosphor B to be mixedly present in order to suppress color unevenness of output light of a light emitting device. Then, the phosphor A is an inorganic compound that emits fluorescence having a light emission peak within a wavelength range of 600 nm or more and less than 660 nm, contains nitrogen, and is activated by $Eu^{2+}$. Moreover, the phosphor B is an inorganic compound that emits fluorescence having a light emission peak within a wavelength range of 400 nm or more and less than 600 nm and is activated by $Eu^{2+}$.

CITATION LIST

Patent Literature

Patent Literature 1: Japanese Patent No. 4621421
Patent Literature 2: Japanese Unexamined Patent Application Publication No. 2012-123940
Patent Literature 3: Japanese Unexamined Patent Application Publication No. 2007-231105

SUMMARY OF INVENTION

When the phosphor single crystal or the translucent phosphor ceramics are used as in Patent Literature 1 or Patent Literature 2, a wavelength converter composed substantially only of a phosphor can be obtained. However, when the phosphor single crystal or the translucent phosphor ceramics are used, it becomes necessary to control a color tone by combining a plurality of types of wavelength converters with one another. Moreover, such a wavelength converter as described above has a high linear transmittance, and LED light and laser light pass therethrough while maintaining strong directivity. For this reason, when the fluorescence emitted by the phosphor and other pieces of light are subjected to additive color mixture, color tone unevenness has occurred, and it has been difficult to control the color tone.

Moreover, when the wavelength converter is designed to include a phosphor activated by $Eu^{2+}$ as in Patent Literature 3, a nitride-based red phosphor can be selected, and accordingly, a wavelength converter in which an intensity of a red light component is large can be obtained. However, the phosphor activated by $Eu^{2+}$ has a little long afterglow, and accordingly, it has been difficult to obtain a high-output phosphor when the phosphor is excited by high-density light such as laser light.

The present invention has been made in consideration of such problems as described above, which are inherent in the prior art. Then, it is an object of the present invention to provide a wavelength converter capable of obtaining high-output fluorescence while making it easy to control the color tone, to provide a method for producing the wavelength converter, and to provide a light emitting device using the wavelength converter.

In order to solve the above-described problems, a wavelength converter according to a first aspect of the present invention includes: a first phosphor composed of an inorganic phosphor activated by $Ce^{3+}$; and a second phosphor composed of an inorganic phosphor activated by $Ce^{3+}$ and different from the first phosphor. At least one of the first phosphor and the second phosphor is particulate. The first phosphor and the second phosphor are bonded to each other by at least one of a chemical reaction in a contact portion between the compound that constitutes the first phosphor and a compound that constitutes the second phosphor and of adhesion between the compound that constitutes the first phosphor and the compound that constitutes the second phosphor.

A method for producing the wavelength converter according to a second aspect of the present invention includes: a molding step of fabricating a molded body composed by mixing a particle group of a first phosphor composed of an inorganic phosphor activated by $Ce^{3+}$ and a particle group of a second phosphor composed of an inorganic phosphor activated by $Ce^{3+}$ and different from the first phosphor; and a bonding step of bonding the first phosphor and the second phosphor to each other, the first phosphor and the second phosphor being included in the molded body.

A light emitting device according to a third aspect of the present invention includes the wavelength converter.

BRIEF DESCRIPTION OF DRAWINGS

FIG. 15(a) is a cross-section photograph showing a state after a surface denoted by reference symbol y in the wavelength converter is roughly polished. FIG. 15(b) is a cross-section photograph showing an enlarged region roughly polished in the wavelength converter. FIG. 15(c) is a photograph showing the surface roughly polished in the wavelength converter. FIG. 15(d) is a photograph showing the surface mechanically polished after being roughly polished in the wavelength converter.

DESCRIPTION OF EMBODIMENTS

Figure 1:
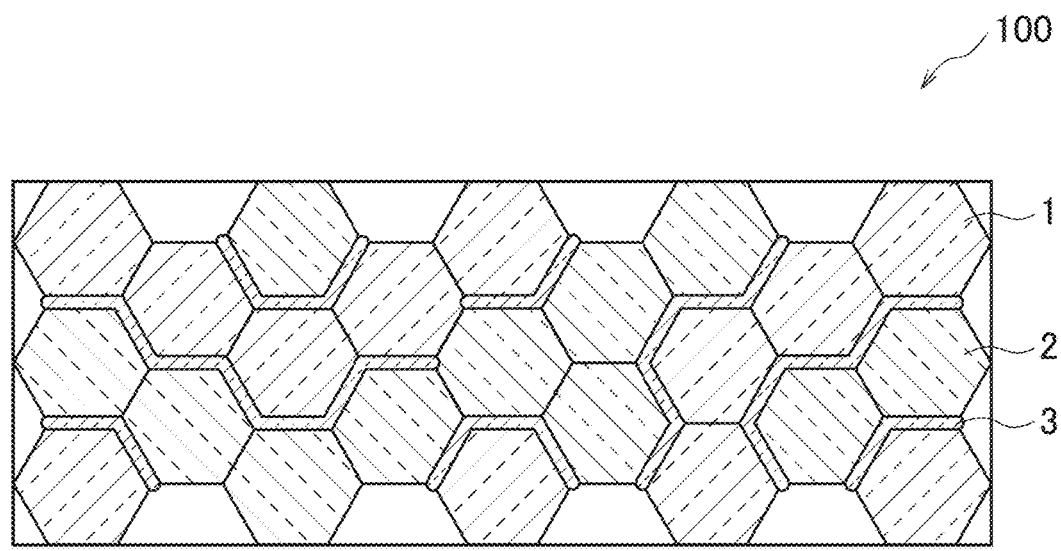
FIG. 1 is a schematic cross-sectional view illustrating an example of a wavelength converter according to an embodiment of the present invention.

This embodiment will be described below with reference to the drawings. Any of embodiments to be described below illustrates a preferred example of this embodiment. Hence, numeric values, shapes, materials, constituents, arrangement positions and connection modes of the constituents, steps, order of the steps, and the like, which are shown in the following embodiments, are merely examples, and are not intended to limit this embodiment.

As a conventional wavelength converter, one is known, which has a structure in which phosphor powder is sealed with an inorganic material. The wavelength converter composed by inorganically sealing the phosphor powder can use a plurality of types of highly efficient phosphor powders each having a light scattering effect, and accordingly, it is easy to control a color tone thereof, and wavelength conversion efficiency thereof can be improved. However, means for filling gaps between phosphor particles with the inorganic material are limited, and accordingly, it is difficult to load the phosphor at a high density, resulting in poor thermal conductivity.

Moreover, when phosphor single crystal or phosphor ceramics are used, a wavelength converter composed substantially only of a phosphor can be obtained. However, in this case, it becomes necessary to control a color tone of the wavelength converter by combining a plurality of types of wavelength converters with one another. Moreover, such a wavelength converter as described above has a high linear transmittance, and LED light and laser light pass therethrough while maintaining strong directivity, and accordingly, color tone unevenness occurs, and it is difficult to control the color tone.

Also when a sintered body of the phosphor is used, such a wavelength converter composed substantially only of the phosphor can be obtained. Moreover, when the wavelength converter is composed of the sintered body of the phosphor, the light scattering effect can be imparted thereto. However, such a single sintered body composed of the plurality of types of phosphors, and particularly, a single sintered body composed of a plurality of types of phosphors including a phosphor (a warm color phosphor) that emits orange or red fluorescence has not substantially attracted attention up to now. Reasons for this include the facts that there have not been high technical requirements, that types of the warm color phosphors serving as technical seeds are limited, and further, that the warm color phosphors serving as candidates for the technical seeds have been materials which are not popular. Therefore, those skilled in the art have recognized that it is difficult to obtain a wavelength converter that contains the plurality of types of phosphors including the warm color phosphor and has high wavelength conversion efficiency.

The wavelength converter according to this embodiment has ultrashort afterglow fluorescence properties, light scattering properties and high thermal conductivity, and accordingly, makes it possible to achieve increased output of a light emitting device and improved quality of output light thereof by being combined with a solid-state light emitting element such as a laser diode.

[Wavelength Converter]

As illustrated in FIG. 1, a wavelength converter 100 according to this embodiment is a wavelength converter including a first phosphor 1 and a second phosphor 2. The first phosphor 1 is composed of an inorganic phosphor activated by $Ce^{3+}$. The second phosphor 2 is also composed of an inorganic phosphor activated by $Ce^{3+}$, but is a phosphor different from the first phosphor 1. Then, at least one of the first phosphor 1 and the second phosphor 2 forms a particulate shape. FIG. 1 illustrates a case where both of the first phosphor 1 and the second phosphor 2 are particulate.

In the wavelength converter 100, a plurality of particles of the first phosphor 1 and a plurality of particles of the second phosphor 2 are mixedly present, and the first phosphor 1 and the second phosphor 2 are bonded to each other through intermediation of a bonding portion 3. Then, the bonding portion 3 is formed by a chemical reaction in a contact portion between a compound that constitutes the first phosphor 1 and a compound that constitutes the second phosphor 2. Specifically, the bonding portion 3 is formed in such a manner that the compound that constitutes the first phosphor 1 and the compound that constitutes the second phosphor 2 are solid-solved.

Moreover, the bonding portion 3 is formed by adhesion of the compound that constitutes the first phosphor 1 and the compound that constitutes the second phosphor 2. Specifically, the bonding portion 3 is formed by an intermolecular force between the compound that constitutes the first phosphor 1 and the compound that constitutes the second phosphor 2, or in such a manner that the compounds engage with each other. As described above, the first phosphor 1 and the second phosphor 2 are bonded to each other through the intermediation of the bonding portion 3, thus making it possible to increase thermal conductivity of the wavelength converter 100. That is, the first phosphor 1 and the second phosphor 2 are bonded to each other by the bonding portion 3 composed of a solid solution or adhesion portion thereof, and the phosphors are coupled to each other by an inorganic material. Therefore, a thermal conduction path between the first phosphor 1 and the second phosphor 2 is formed by the bonding portion 3, thus making it possible to increase thermal conductivity of the whole of the wavelength converter. Moreover, the thermal conductivity of the wavelength converter is increased, and the wavelength converter efficiently dissipates heat generated therein following excitation of high-density light, thus making it possible to suppress temperature quenching of the phosphors.

Note that, preferably, the particles of the first phosphor 1 and the particles of the second phosphor 2 are also mutually bonded by at least one of the solid solution and the adhesion in the contact portion.

As mentioned above, in the wavelength converter 100, the plurality of particles of the first phosphor 1 and the plurality of particles of the second phosphor 2 are mixedly present. Therefore, on an interface between the first phosphor 1 and the second phosphor 2 and on the bonding portion 3, incident light is refracted and reflected. That is, in the wavelength converter 100, the first phosphor 1 and the second phosphor 2 function as light scattering bodies. Therefore, when coherent light such as laser light, which has high directivity, is used as the incident light, it becomes possible to relieve the coherent light by light scattering, and to perform wavelength conversion for the coherent light into light that has a distribution approximate to the Lambertian distribution, in which glittered looking is suppressed.

The first phosphor 1 and the second phosphor 2 include $Ce^{3+}$ as emission centers. A fluorescence lifetime of $Ce^{3+}$ is $10^{-8}$ to $10^{-7}$ s, and afterglow properties thereof are extremely low in comparison with other emission centers such as $Eu^{2+}$. Therefore, even under an excitation condition of high-density light such as high-power laser light, a high fluorescence output can be obtained, which has a reduced saturation phenomenon and is substantially proportional to a density of excitation light. Moreover, an emission color of $Ce^{3+}$ changes depending on a base material, and accordingly, it is easy to change a color tone of the output light.

A shape of the wavelength converter 100 of this embodiment is not particularly limited. Preferably, the wavelength converter 100 has a thin plate shape, and also preferably, has a disc shape or a rectangular plate shape. The wavelength converter 100 having such a shape becomes easy to produce and handle.

A size of the wavelength converter 100 is not particularly limited, either. In the wavelength converter 100, a maximum lateral length on a cross section thereof is preferably 0.1 mm or more and less than 100 mm, more preferably 1 mm or more and less than 30 mm. Moreover, a minimum lateral length on the cross section of the wavelength converter 100 is also preferably 0.1 mm or more and less than 100 mm, more preferably 1 mm or more and less than 30 mm. A thickness of the wavelength converter 100 is preferably 30 µm or more and less than 1 cm, more preferably 50 µm or more and less than 3 mm.

Preferably, the wavelength converter 100 has a size equivalent to a projection area larger than a spot diameter of the laser light (generally, several 10 µm or more and less than 5 mm). In this case, it becomes possible to irradiate the wavelength converter 100 with all the laser light, and accordingly, efficient wavelength conversion is enabled.

Such a combination of the first phosphor 1 and the second phosphor 2, which are included in the wavelength converter 100, is capable of adopting a variety of modifications. The wavelength converter 100 of FIG. 1 is an example of a combination in which an average particle size of the first phosphor 1 is approximately equal to an average particle size of the second phosphor 2. When the average particle sizes of the first phosphor 1 and the second phosphor 2 are approximately equal to each other, a wavelength converter is formed, in which size inequality of the phosphor particles is little in any three-dimensional directions. Therefore, a wavelength converter capable of emitting output light having uniform orientation characteristics can be obtained. Moreover, in a case of such a configuration as in FIG. 1, such a wavelength converter is formed, in which the bonding portion 3 of the first phosphor 1 and the second phosphor 2 is relatively a little. Accordingly, a wavelength converter can be obtained, which definitely has characteristics of both of the first phosphor 1 and the second phosphor 2.

Figure 2:
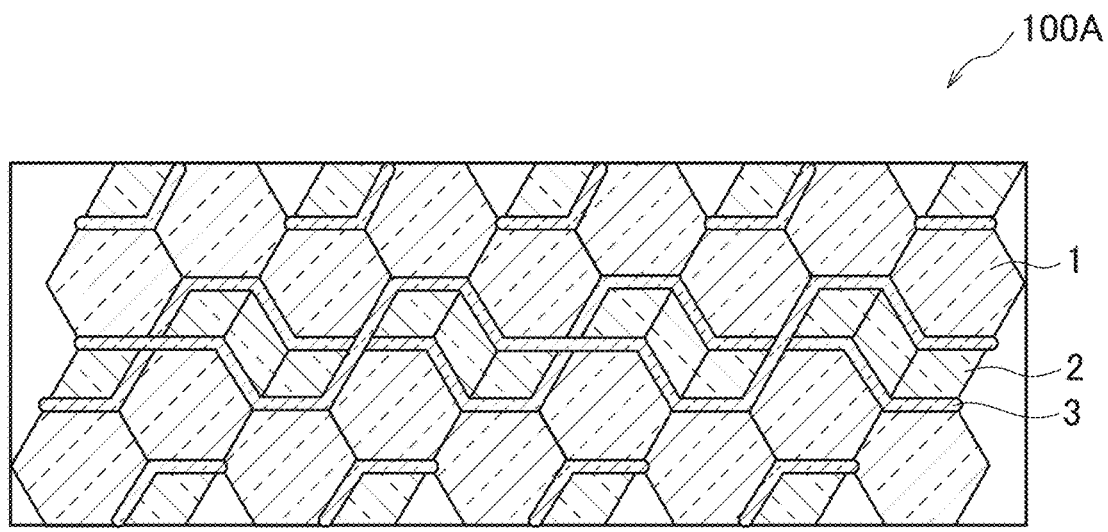
FIG. 2 is a schematic cross-sectional view illustrating another example of the wavelength converter according to the embodiment of the present invention.

A wavelength converter 100A of FIG. 2 is an example where the average particle size of the first phosphor 1 is larger than the average particle size of the second phosphor 2. When the average particle size of the first phosphor 1 is larger than the average particle size of the second phosphor 2, gaps of the phosphor having a larger particle size are filled with the phosphor having a smaller particle size. Therefore, a filling density of the phosphor increases, thus making it possible to obtain the wavelength converter 100A having good wavelength conversion efficiency. Note that, in the wavelength converter of this embodiment, it is also preferable that the average particle size of the first phosphor 1 be smaller than the average particle size of the second phosphor 2.

Figure 3:
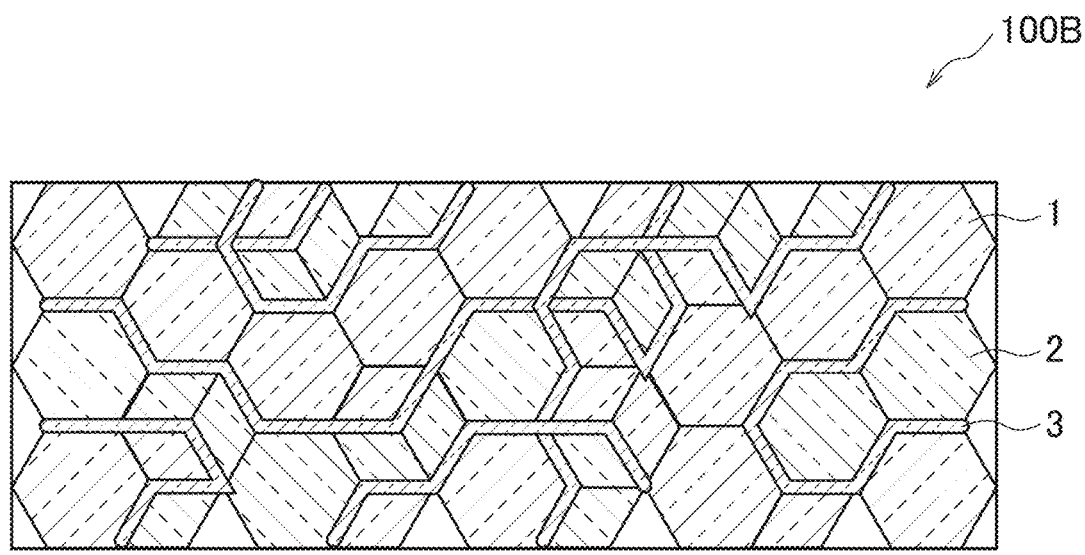
FIG. 3 is a schematic cross-sectional view illustrating still another example of the wavelength converter according to the embodiment of the present invention.

A wavelength converter 100B of FIG. 3 is an example where, in both of the first phosphor 1 and the second phosphor 2, particles having a large particle size and particles having a small particle size are mixedly present. With such a configuration, gaps of the phosphor having a large particle size are filled with the phosphor having a small particle size like the wavelength converter 100A of FIG. 2. Therefore, the filling density of the phosphor increases, thus making it possible to obtain the wavelength converter 100B having good wavelength conversion efficiency.

Figure 4:
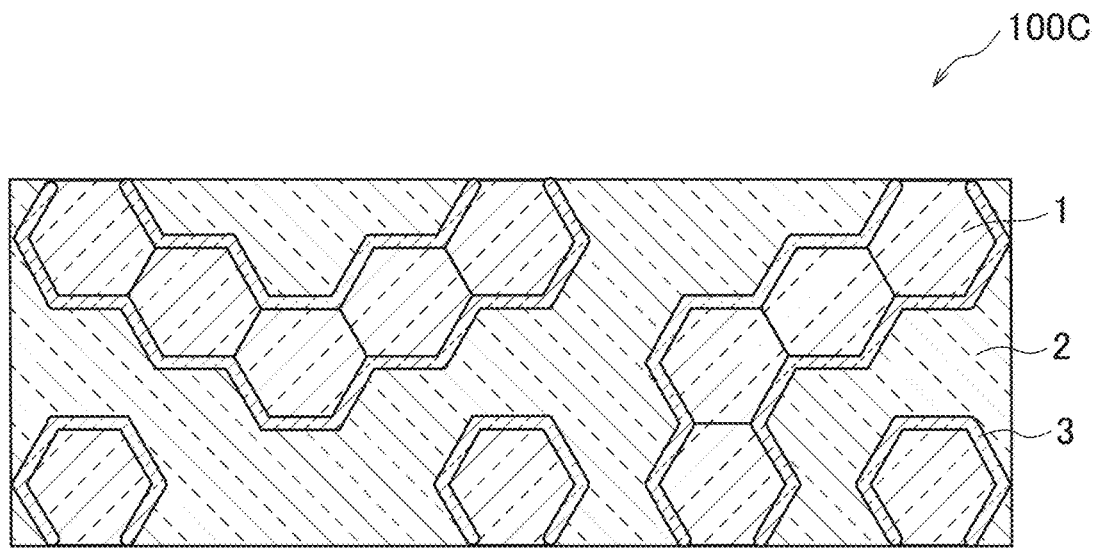
FIG. 4 is a schematic cross-sectional view illustrating yet another example of the wavelength converter according to the embodiment of the present invention.

A wavelength converter 100C of FIG. 4 is an example, where the second phosphor 2 is used as a base, and the particles of the first phosphor 1 are dispersed inside the second phosphor 2. With such a configuration, the gaps of the first phosphor 1 are filled with the second phosphor 2. Therefore, the filling density of the phosphor increases, thus making it possible to obtain the wavelength converter 100C having good wavelength conversion efficiency. Note that the wavelength converter of this embodiment may be in an aspect where the first phosphor 1 is used as a base, and the particles of the second phosphor 2 are dispersed inside the first phosphor 1.

In the wavelength converter 100 of this embodiment, it is preferable that the first phosphor 1 emit fluorescence different in color from that of the second phosphor 2. When a luminescent color of the first phosphor 1 is different from a luminescent color of the second phosphor 2, types and content ratios of the first phosphor 1 and the second phosphor 2 are appropriately changed, thus making it possible to obtain a wavelength converter that emits output light having a controlled color tone.

In the wavelength converter 100 of this embodiment, it is preferable that melting points of the first phosphor 1 and the second phosphor 2 be different from each other. At this time, it is preferable that a difference between the melting points of the first phosphor 1 and the second phosphor 2 be 100° C. or more. Moreover, it is preferable that the melting point of the phosphor having a lower melting point between the first phosphor 1 and the second phosphor 2 be less than 1600° C. When the melting point of the first phosphor 1 and the melting point of the second phosphor 2 are different from each other, use of the difference between the melting points makes it possible to form a wavelength converter in which a particulate properties and other properties than the particulate properties are mixedly present.

In the wavelength converter 100 of this embodiment, it is preferable that the first phosphor 1 and the second phosphor 2 include mutually different compounds serving as base materials of the phosphors concerned. For example, it is preferable that one of the first phosphor 1 and the second phosphor 2 be a silicate-based phosphor, and that the other of the first phosphor 1 and the second phosphor 2 be an aluminate-based phosphor. Note that the silicate-based phosphor refers to a phosphor composed of only silicate, or a phosphor composed of a solid solution in which a solid solution ratio of silicate serving as an end member is 70 mol % or more. The aluminate-based phosphor refers to a phosphor composed of only aluminate, or a phosphor composed of a solid solution in which a solid solution ratio of aluminate serving as an end member is 70 mol % or more.

Generally, the silicate-based phosphor has a lower melting point than the aluminate-based phosphor, and has a large melting point difference therefrom. Therefore, by using the silicate-based phosphor and the aluminate-based phosphor, such a wavelength converter in which the particulate phosphor and the phosphor having the other properties than the particulate properties are mixedly present can be obtained. Moreover, after the silicate-based phosphor of which melting point is low and the aluminate-based phosphor are mixed with each other, a resultant mixture is heated at a temperature around the melting point of the silicate-based phosphor, thus making it easy to form the solid solution in a contact portion between the silicate-based phosphor and the aluminate-based phosphor. Therefore, it becomes possible to obtain a wavelength converter in which a bonding force between the phosphor particles is large.

As mentioned above, in the wavelength converter 100, the first phosphor 1 and the second phosphor 2 are bonded to each other through the intermediation of the bonding portion 3, and it is preferable that the bonding portion 3 be formed by the chemical reaction in the contact portion between the compound that constitutes the first phosphor 1 and the compound that constitutes the second phosphor 2. Therefore, it is preferable that the first phosphor 1 and the second phosphor 2 be solid-solved with each other. Thus, the first phosphor 1 and the second phosphor 2 form a structure of being bonded to each other while changing a composition thereof through intermediation of the solid solution of both thereof. Therefore, the bonding force between the phosphor particles is strong, and the phosphor particles become difficult to separate from one another, and accordingly, it becomes possible to obtain a wavelength converter excellent in mechanical strength.

As described above, in the wavelength converter 100, it is preferable that the first phosphor 1 and the second phosphor 2 have properties of being solid-solved with each other. Thus, it becomes easy to form the bonding portion 3 composed in such a manner that the first phosphor 1 and the second phosphor 2 are solid-solved with each other.

It is preferable that the wavelength converter 100 of this embodiment include only elements that constitutes the first phosphor 1 and elements that constitutes the second phosphor 2. That is, it is preferable that the wavelength converter 100 should not include an element other than the elements which constitute the first phosphor 1 and the second phosphor 2. Thus, a wavelength converter is formed, which does not include an unnecessary element that brings about decreases of fluorescence output and reliability of each of the first phosphor 1 and the second phosphor 2. Therefore, it becomes possible to obtain a wavelength converter for which high conversion efficiency and high reliability can be expected.

It is preferable that the wavelength converter 100 be substantially composed of the first phosphor 1, the second phosphor 2, and the bonding portion 3 of the first phosphor 1 and the second phosphor 2. That is, the wavelength converter 100 includes the first phosphor 1, the second phosphor 2 and the bonding portion 3, and besides, may have a configuration that does not affect an action and effect of the wavelength converter 100. However, it is preferable that the wavelength converter 100 should not have another configuration that affects the action and effect thereof. Thus, the wavelength converter 100 does not include such an unnecessary substance that brings about the decreases of the fluorescence output and the reliability, and accordingly, the wavelength converter for which high conversion efficiency and high reliability can be expected can be obtained.

It is preferable that the wavelength converter 100 be a sintered body that is composed in such a manner that the first phosphor 1 and the second phosphor 2 are sintered to each other, and has a plurality of air gaps in the inside thereof. Moreover, it is preferable that the wavelength converter 100 be a ceramic body that is composed in such a manner that the first phosphor 1 and the second phosphor 2 are sintered to each other, and does not have a plurality of air gaps in the inside thereof. The wavelength converter 100 is the sintered body or the ceramic body, which is as described above, whereby it becomes easy to produce and handle the wavelength converter, and accordingly, a wavelength converter suitable to industrial production is formed.

It is preferable that the wavelength converter 100 be composed of only inorganic oxides. That is, it is preferable that all of the first phosphor, the second phosphor and the bonding portion 3 be composed of inorganic oxides. In this case, not only it becomes easy to handle the wavelength converter in a normal-pressure atmosphere, but also it becomes easy to produce the above-mentioned sintered body and ceramic body. Therefore, such a wavelength converter suitable for the industrial production is formed.

It is preferable that the wavelength converter 100 be composed of only garnet compounds. That is, it is preferable that the wavelength converter 100 be composed of only compounds, each of which has a crystal structure of garnet. Moreover, it is preferable that the first phosphor 1, the second phosphor 2 and the bonding portion 3 be compounds, each of which has the crystal structure of garnet. The garnet compounds are chemically stable, and are easy to handle in the normal-pressure atmosphere. Then, when the wavelength converter 100 is composed of only the garnet compounds, the wavelength converter 100 is composed of only compounds chemically similar to one another, and accordingly, a wavelength converter more suitable for the industrial production is formed.

It is known that each of the garnet compounds is present as a solid solution of a plurality of end members in nature, and the garnet compounds have properties of being liable to form a solid solution together. Therefore, when the first phosphor 1 and the second phosphor 2 are compounds, each of which has the crystal structure of garnet, then the first phosphor 1 and the second phosphor 2 are liable to form a solid solution, and accordingly, it becomes easy to bond the first phosphor 1 and the second phosphor 2 to each other through the intermediation of the bonding portion 3.

Moreover, it is easy to turn the phosphor particles of the garnet compounds into monodispersed particles having polygonal shapes or monodispersed particles having shapes approximate to polygons. Therefore, it becomes possible to obtain a wavelength converter that has a large filling ratio of the phosphors and is excellent in translucency.

In the wavelength converter 100, it is preferable that the average particle size of the particulate phosphor be 1 μm or more and less than 100 μm. That is, in the wavelength converter 100, at least one of the first phosphor 1 and the second phosphor 2 is particulate, and accordingly, it is preferable that the average particle size of the phosphor remain within the above-described range. Moreover, in the wavelength converter 100, the average particle size of the particulate phosphor is more preferably 3 μm or more and less than 50 μm, particularly preferably 5 μm or more and less than 40 μm. The phosphor having such a particle size is easy to absorb and scatter light ranging from the near-ultraviolet region to the visible region, and has a high practical use result as a material for use in the light emitting device. Therefore, when the phosphor having the particle size as described above is used, such a wavelength converter having high practical use performance as a material for use in the light emitting device can be obtained. Note that the particle size of the phosphor in the wavelength converter 100 refers to a maximum axial length of the phosphor particles when the cross section of the wavelength converter is observed by a microscope.

It is preferable that the emission center included in the wavelength converter 100 be only $Ce^{3+}$. In the phosphor including the trivalent cerium ions ($Ce^{3+}$), even under an excitation condition of high-power density light, a high fluorescence output can be obtained, which has a reduced saturation phenomenon and is substantially proportional to a density of excitation light. Moreover, even if the emission center is diffused between particles of different types of phosphors at the time of producing the wavelength converter, and so on, it becomes possible to obtain a wavelength converter in which fluctuations of the wavelength conversion characteristics are small.

Note that $Ce^{3+}$ is an emission center that has ultrashort afterglow properties, in which an emission color changes depending on a base material thereof. Therefore, when the emission center included in the wavelength converter 100 is only $Ce^{3+}$, it is easy to change the color tone of the output light, and further, it becomes possible to hold a high output even under high-density light irradiation. Note that the "high-density light irradiation" refers to light irradiation in which an intensity of excitation light applied to the wavelength converter is 1 $W/mm^2$ or more, particularly 3 $W/mm^2$ or more, and is light irradiation in which the intensity of the excitation light is 1 $W/mm^2$ or more and less than 100 $W/mm^2$. Note that, in use of the wavelength converter, light irradiation in which an intensity of excitation light is less than 10 $W/mm^2$ or less than 50 $W/mm^2$ is sometimes sufficient. However, in use of the wavelength converter, light irradiation in which the intensity of the excitation light is 10 $W/mm^2$ or more, and further 50 $W/mm^2$ or more is sometimes required, and in accordance with the wavelength converter of this embodiment, it becomes possible to deal with such use.

In the wavelength converter 100, it is preferable that either one of the first phosphor 1 and the second phosphor 2 be a phosphor that emits light having a fluorescence peak within a wavelength range of 580 nm or more and less than 630 nm. Moreover, it is more preferable that either one of the first phosphor 1 and the second phosphor 2 be a phosphor that emits light having a fluorescence peak within a wavelength range of 590 nm or more and less than 620 nm. It is particularly preferable that either one of the first phosphor 1 and the second phosphor 2 be a phosphor that emits light having a fluorescence peak within a wavelength range of 600 nm or more and less than 615 nm. In this case, it becomes possible to emit fluorescence in which a ratio of a red light component with a relatively high luminosity function is high, and accordingly, a wavelength converter suitable for use in illumination can be obtained.

As mentioned above, in the wavelength converter 100, it is preferable that either one of the first phosphor 1 and the second phosphor 2 be a phosphor that emits light having a fluorescence peak within the wavelength range of 580 nm or more and less than 630 nm. Then, it is preferable that the other one of the first phosphor 1 and the second phosphor 2 be a phosphor that emits light having a fluorescence peak within a wavelength range of 480 nm or more and less than 550 nm. Moreover, it is more preferable that the other one of the first phosphor 1 and the second phosphor 2 be a phosphor that emits light having a fluorescence peak within a wavelength range of 490 nm or more and less than 530 nm. Further, it is particularly preferable that the other one of the first phosphor 1 and the second phosphor 2 be a phosphor that emits light having a fluorescence peak within a wavelength range of 500 nm or more and less than 515 nm. The wavelength converter 100 as described above also includes a phosphor in which amounts of a blue-green light component and a green light component are large, and accordingly, a wavelength converter particularly suitable for use in illumination can be obtained.

In the wavelength converter 100, it is preferable that the first phosphor 1 and the second phosphor 2 be excited by light having a peak within a wavelength range of 380 nm or more and less than 500 nm. Moreover, it is preferable that the first phosphor 1 and the second phosphor 2 be excited by light having a peak within a wavelength range of 400 nm or more and less than 470 nm. Further, it is further preferable that the first phosphor 1 and the second phosphor 2 be excited by light having a peak within a wavelength range of either 400 nm or more and less than 415 nm or 440 nm or more and less than 470 nm. Particularly, it is preferable that the first phosphor 1 and the second phosphor 2 be excited by light having a peak within a wavelength range of 450 nm or more and less than 460 nm. In this case, the first phosphor 1 and the second phosphor 2 can be excited by short wavelength visible light from violet to blue, particularly blue light well-balanced in terms of color purity and luminosity function. Therefore, the wavelength converter 100 is combined with a solid-state light emitting element such as a light emitting diode and a laser diode, whereby it becomes possible to obtain a light emitting device using the short wavelength visible light and the fluorescence emitted by the phosphor.

In the wavelength converter 100, it is preferable that mixed color light of first fluorescence emitted by the first phosphor 1 and second fluorescence emitted by the second phosphor 2 become white light by additive color mixture with blue light. The wavelength converter that can form white light by the additive color mixture with blue light is demanded much for illumination light, and accordingly, becomes suitably usable for the light emitting device.

In the wavelength converter 100, it is preferable that the fluorescence emitted by one of the first phosphor 1 and the second phosphor 2 excite the other of the first phosphor 1 and the second phosphor 2. That is, it is preferable that the other of the first phosphor 1 and the second phosphor 2 absorb the fluorescence emitted by one of the first phosphor 1 and the second phosphor 2 and be excited thereby. In this case, it becomes possible to excite the other phosphor by one of the phosphors, and accordingly, it becomes possible to expand options for usable phosphors. Moreover, use of a light interference effect between the phosphors makes it possible to obtain a wavelength converter that has a spectral distribution unachievable by a simple combination of the phosphors.

In the wavelength converter 100 of this embodiment, it is preferable that a phosphor usable as the first phosphor 1 and the second phosphor 2 be at least one selected from the group consisting of an oxide-based phosphor, a sulfide-based phosphor, a nitride-based phosphor and a halide-based phosphor. Moreover, a preferable phosphor as the first phosphor 1 and the second phosphor 2 is the oxide-based phosphor easy to handle in the atmosphere and at a normal pressure. It is preferable that the first phosphor 1 and the second phosphor 2 be at least one selected from the group consisting of oxide, silicate, aluminate, phosphate, borate, halo-silicate, halo-aluminate and halo-phosphate. Such phosphors as described above are easy to produce industrially, and accordingly, can be used particularly suitably.

As the oxide-based phosphor, for example, there can be mentioned: a garnet phosphor activated by $Ce^{3+}$, such as $Y_3Al_2(AlO_4)_3:Ce^{3+}$, $Ca_3Sc_2(SiO_4)_3:Ce^{3+}$ and $Lu_2CaMg_2(SiO_4)_3:Ce^{3+}$; a calcium ferrite-type phosphor activated by $Ce^{3+}$, such as $MSc_2O_4:Ce^{3+}$ and $MLu_2O_4:Ce^{3+}$; and an oxyfluoride phosphor activated by $Ce^{3+}$, such as $M_3AlO_4F:Ce^{3+}$. Herein, M is at least one element selected from Ca, Sr and Ba.

As the sulfide-based phosphor, for example, there can be mentioned phosphors of $Ce^{3+}$-tactivated alkaline earth metal sulfide and thiogallate, such as $MS:Ce^{3+}$ and $MGa_2S_4:Ce^{3+}$. Herein, M is at least one element selected from Ca, Sr and Ba.

As the nitride-based phosphor, for example, there can be mentioned a phosphor selected from that of $Ce^{3+}$-activated oxynitride alumino nitride silicate, nitride silicate, oxynitride silicate and nitride alumino silicate such as $LaAl(Si,Al)_6(N,O)_{10}:Ce^{3+}$, $LaSi_3N_5:Ce^{3+}$, $Ca$-$\alpha$-sialon:$Ce^{3+}$, $CaAlSiN_3:Ce^{3+}$ and $La_3Si_6N_{11}:Ce^{3+}$.

It is preferable that a crystal structure of the phosphor usable as the first phosphor 1 and the second phosphor 2 be of a garnet type, a perovskite type, an apatite type, a $K_2NiF_4$ type, an olivine type, an A rare earth type, a B rare earth type, a C rare earth type, a spinel type, a scheelite type or a calcium ferrite type. Note that, preferably, the crystal structure is a structure that has many compounds which function as base materials of a highly efficient phosphor. Therefore, it is more preferable that the crystal structure of the phosphor usable as the first phosphor 1 and the second phosphor 2 be of the perovskite type, the apatite type, the $K_2NiF_4$ type, the garnet type, the olivine type, the spinel type, or the calcium ferrite type.

As specific examples of the oxide having the garnet-type crystal structure, there are mentioned: $Ca_3Sc_2(SiO_4)_3$ and $Lu_2CaMg_2(SiO_4)_3$ as silicate that serves as an end member; $Y_3Mg_2(SiO_4)_2(AlO_4)$, $Y_3MgAl(AlO_4)_2(SiO_4)$, $Lu_3Mg_2(SiO_4)_2(AlO_4)$, $Y_2BaAl_2(AlO_4)_2(SiO_4)$, $Y_2MgAl_2(AlO_4)_2(SiO_4)$, $Y_2CaAl_2(AlO_4)_2(SiO_4)$, $Lu_2CaAl_2(AlO_4)_2(SiO_4)$ and $Ca_3Zr_2(AlO_4)_2(SiO_4)$ as aluminosilicate that serves as an end member; $Lu_3Al_2(AlO_4)_3$, $Y_3Al_2(AlO_4)_3$, $Gd_3Al_2(AlO_4)_3$, $Tb_3Al_2(AlO_4)_3$, $Y_3Ga_2(AlO_4)_3$, $Y_3SC_2(AlO_4)_3$, $Ca_2YZr_2(AlO_4)_3$, $Ca_2EuZr_2(AlO_4)_3$, $Ca_2GdZr_2(AlO_4)_3$, $Ca_2TbZr_2(AlO_4)_3$, $Ca_2LuZr_2(AlO_4)_3$, $Ca_2YHf_2(AlO_4)_3$ as aluminate that serves as an end member; and the like. In this embodiment, there can be used such phosphors in which the emission center (for example $Ce^{3+}$) is added to these compounds each of which serves as base material.

In the wavelength converter of this embodiment, it is preferable that the first phosphor 1 be a $Ce^{3+}$-activated phosphor using $Lu_2CaMg_2(SiO_4)_3$ as a base material. $Lu_2CaMg_2(SiO_4)_3:Ce^{3+}$ is garnet silicate that emits orange light, and has characteristics in which temperature quenching is relatively small. Therefore, by using this phosphor, a wavelength converter can be obtained, which emits a large quantity of a red light component required for use in illumination and is suitable for use of high output.

In the wavelength converter of this embodiment, it is preferable that the second phosphor 2 be a $Ce^{3+}$-tactivated phosphor using, as a base material, $Ca_3Sc_2(SiO_4)_3$ or $Lu_3Al_2(AlO_4)_3$ which is a garnet compound. $Ca_3Sc_2(SiO_4)_3:Ce^{3+}$ and $Lu_3Al_2(AlO_4)_3:Ce^{3+}$ are phosphors which emit blue-green to green light. Therefore, by additive color mixture of the orange light emitted by the above-mentioned first phosphor 1 and the blue-green to green light emitted by the second phosphor 2, a wavelength converter that emits a white or yellow light component can be obtained. Moreover, $Ca_3Sc_2(SiO_4)_3:Ce^{3+}$ and $Lu_3Al_2(AlO_4)_3:Ce^{3+}$ have properties of forming a solid solution with $Lu_2CaMg_2(SiO_4)_3:Ce^{3+}$. Therefore, at the contact portion between the first phosphor and the second phosphor, the bonding portion 3 composed of the solid solution can be formed easily.

As described above, a preferable combination of the phosphors is composed of: the first phosphor 1, which is the $Ce^{3+}$-activated phosphor using $Lu_2CaMg_2(SiO_4)_3$ as a base material; and the second phosphor 2, which is the $Ce^{3+}$-activated phosphor using $Ca_3Sc_2(SiO_4)_3$ or $Lu_3Al_2(AlO_4)_3$ as a base material. It is preferable that the wavelength converter of this embodiment have at least the combination of the above-described phosphors.

Note that the $Ce^{3+}$-activated phosphor using $Lu_2CaMg_2(SiO_4)_3$ as a base material refers to a phosphor composed of only $Lu_2CaMg_2(SiO_4)_3:Ce^{3+}$, or a phosphor composed of a solid solution in which a solid solution ratio of $Lu_2CaMg_2(SiO_4)_3:Ce^{3+}$ is 70 mol % or more.

Likewise, the $Ce^{3+}$-activated phosphor using $Ca_3Sc_2(SiO_4)_3$ as a base material refers to a phosphor composed of only $Ca_3Sc_2(SiO_4)_3:Ce^{3+}$, or a phosphor composed of a solid solution in which a solid solution ratio of $Ca_3Sc_2(SiO_4)_3:Ce^{3+}$ is 70 mol % or more. Moreover, the $Ce^{3+}$-activated phosphor using $Lu_3Al_2(AlO_4)_3$ as a base material refers to a phosphor composed of only $Lu_3Al_2(AlO_4)_3:Ce^{3+}$, or a phosphor composed of a solid solution in which a solid solution ratio of $Lu_3Al_2(AlO_4)_3:Ce^{3+}$ is 70 mol % or more.

The second phosphor 2, which is particularly preferable, is the $Ce^{3+}$-activated phosphor using $Lu_3Al_2(AlO_4)_3$ as a base material. $Lu_3Al_2(AlO_4)_3:Ce^{3+}$ is aluminate, and has a melting point higher than $Lu_2CaMg_2(SiO_4)_3:Ce^{3+}$ as silicate by 100° C. or more. When the first phosphor 1 is $Lu_2CaMg_2(SiO_4)_3:Ce^{3+}$, and the second phosphor 2 is $Lu_3Al_2(AlO_4)_3:Ce^{3+}$, then the solid solution of the first phosphor 1 and the second phosphor 2 is not accelerated extremely even if a sintering temperature is brought close to the melting point of the first phosphor 1. Therefore, a wavelength converter in which fluorescence properties of the first phosphor 1 and the second phosphor 2 are clear can be obtained.

Note that the wavelength converter of this embodiment is capable of further including a phosphor different from the first phosphor 1 and the second phosphor 2. Thus, a wavelength converter in which a color tone of fluorescence is adjusted can be obtained.

It is preferable that the wavelength converter 100 of this embodiment have translucency. Thus, it becomes possible to obtain a wavelength converter capable of transmitting the first fluorescence emitted by the first phosphor 1 and the second fluorescence emitted by the second phosphor 2 in addition to the excitation light. Note that, preferably, in a wavelength range where a wavelength is 380 nm or more and 780 nm or less, the wavelength converter 100 has a diffuse transmittance of 60% or more, more preferably 80% or more. Thus, a wavelength converter excellent in light transparency can be obtained.

Note that, in the wavelength range where the wavelength is 380 nm or more and 780 nm or less, the diffuse transmittance of the wavelength converter 100 may be less than 60%, and particularly less than 40%. Thus, a wavelength converter that combines light transparency and light reflectivity with each other can be obtained.

Meanwhile, it is also preferable that the wavelength converter should not have translucency. In this way, a wavelength converter that does not transmit light therethrough is formed. Therefore, the excitation light reflected by the wavelength converter, the first fluorescence emitted by the first phosphor 1 and the second fluorescence emitted by the second phosphor 2 are radiated from only an irradiated surface of the excitation light. Hence, it becomes possible to perform additive color mixture for these pieces of light on the irradiated surface of the excitation light in the wavelength converter.

The wavelength converter 100 can also be configured to emit at least one of the first fluorescence emitted by the first phosphor 1 and the second fluorescence emitted by the second phosphor 2 from a surface different from the irradiated surface of the excitation light. In this way, a wavelength converter is formed, which transmits therethrough at least one of the first fluorescence emitted by the first phosphor 1 and the second fluorescence emitted by the second phosphor 2. Therefore, a wavelength converter capable of outputting at least one of the first fluorescence and the second fluorescence can be obtained.

It is preferable that the wavelength converter of this embodiment further include a substrate 10. A wavelength converter 100D illustrated in FIG. 5 includes the substrate 10, and is configured to cause the substrate 10 to support the whole of the sintered body of the first phosphor 1 and the second phosphor 2. Moreover, a wavelength converter 100E illustrated in FIG. 6 includes a substrate 10A, and is configured to cause the substrate 10A to partially support the sintered body of the first phosphor 1 and the second phosphor 2. With such a configuration, even if the wavelength converter 100 is so thin that mechanical strength thereof is insufficient, it becomes possible to handle the wavelength converter 100 easily.

Figure 5:
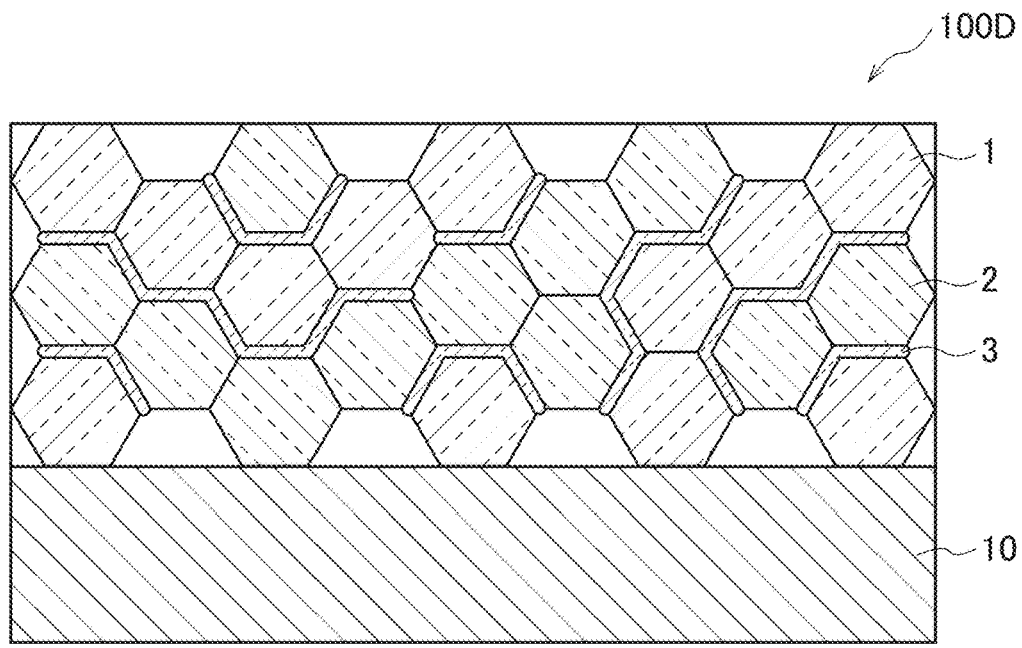
FIG. 5 is a schematic cross-sectional view illustrating an example where a substrate is provided in the wavelength converter according to the embodiment of the present invention.
Figure 6:
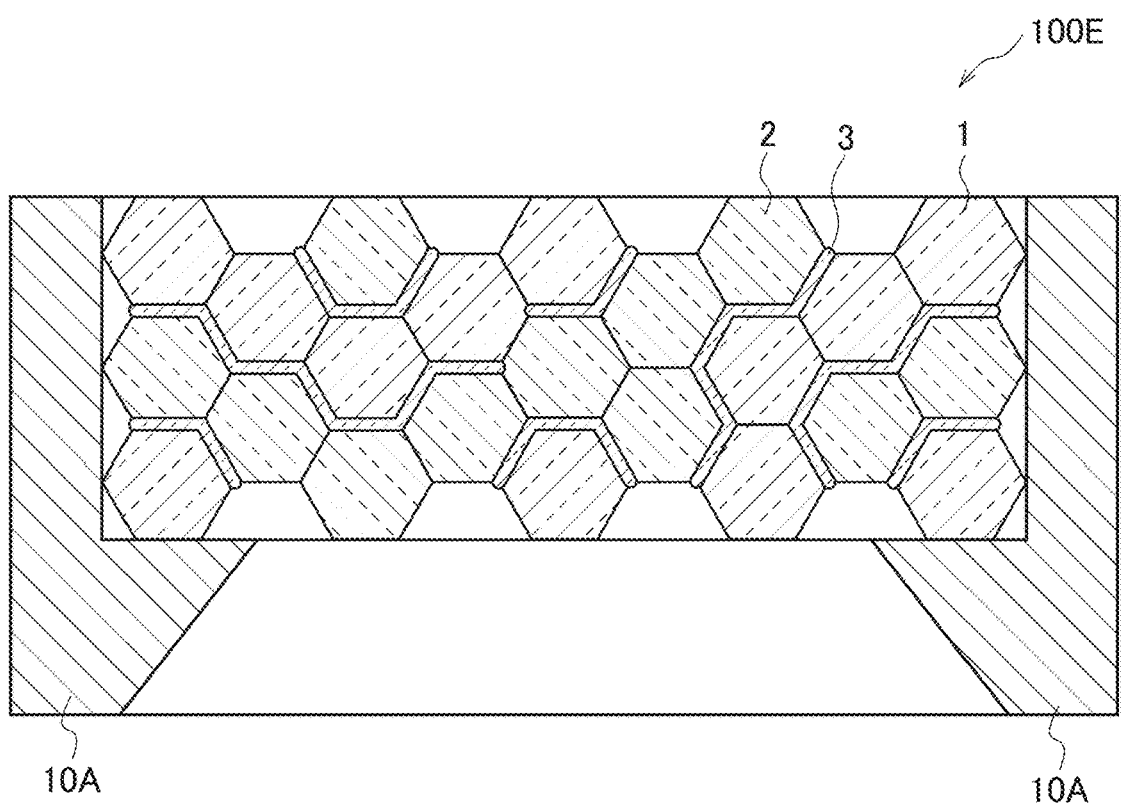
FIG. 6 is a schematic cross-sectional view illustrating another example where the substrate is provided in the wavelength converter according to the embodiment of the present invention.

In this embodiment, the substrate may be configured to be brought into surface contact with a specific surface of the wavelength converter 100. For example, as illustrated in FIG. 5, the substrate 10 may have a flat plate shape, and may be configured to contact a lower surface of the wavelength converter 100 and to support the whole of the lower surface. Moreover, in this embodiment, the substrate may be configured to surround a side surface of the wavelength converter 100. For example, as illustrated in FIG. 6, the substrate 10A may be configured to surround the whole of the side surface of the wavelength converter 100, and to further support an outer peripheral portion of the lower surface of the wavelength converter 100.

A material of the substrates 10 and 10A is not particularly limited, and is preferably at least one selected from the group consisting of metal, a semiconductor, an electrical insulator, and a complex or laminate of these. As specific examples of the material of the substrates 10 and 10A, there can be mentioned stainless steel, aluminum, copper, silicon, alumina, quartz and glass.

The substrates 10 and 10A may be those in each of which at least a part or all of a surface is coated with an electrically insulating material or metal. Thus, bonding strength between the wavelength converter 100 and the substrates 10 and 10A is increased, thus making it possible to improve dissipation efficiency of heat generated in the wavelength converter 100. Moreover, it also becomes possible to reflect the fluorescence, which is emitted by the wavelength converter 100, in one direction.

The substrates 10 and 10A may have translucency. In this case, the substrates 10 and 10A become capable of also serving to protect a light output surface of the wavelength converter 100. Moreover, the substrates 10 and 10A may have light reflection characteristics. In this case, the substrates 10 and 10A become capable of acting as reflectors which can output the fluorescence, which is emitted by the wavelength converter 100, in one direction.

As mentioned above, the shape of the wavelength converter 100 of this embodiment is not particularly limited, and for example, the wavelength converter 100 can be formed into a plate shape. Herein, when the wavelength converter 100 has a plate shape, it is preferable that the wavelength converter 100 have a smooth surface. The wavelength converter 100 has a plate shape, and further, one surface thereof is smooth, whereby a transmission amount and reflection amount of the excitation light, for example, such as blue laser light change appropriately. Therefore, it becomes possible to easily control a color tone of output light obtained by additive color mixture of the excitation light and mixed color light of the fluorescence emitted by the first phosphor 1 and the fluorescence emitted by the second phosphor 2.

Moreover, it is preferable that the smooth surface of the wavelength converter 100 be an incident surface of the excitation light. The smooth surface of the wavelength converter 100 is used as the incident surface of the excitation light such as laser light, thus making it possible to increase incidence efficiency of the excitation light to the wavelength converter 100. Particularly, the wavelength converter 100 is configured so that the excitation light enters the smooth surface of the wavelength converter 100 in a direction substantially perpendicular to the smooth surface, thus making it possible obtain a light emitting device that has high incidence efficiency of the excitation light to the wavelength converter 100. Note that the "direction substantially perpendicular to the smooth surface" refers to a direction of 90°±30° with respect to the smooth surface, and more preferably, is a direction of 90°±10° with respect to the smooth surface.

It is preferable that the wavelength converter 100 have an irregular surface in addition to the smooth surface. That is, in the plate-shaped wavelength converter 100, it is preferable that one main surface be the smooth surface, and that an opposite main surface with the one main surface be the irregular surface. By the fact that the opposite main surface of the wavelength converter 100 is irregular, extraction efficiency of the output light from the irregular surface can be increased. Therefore, it becomes possible to obtain a wavelength converter in which an extraction amount of the output light from the irregular surface is local large.

As described above, it is preferable that the wavelength converter 100 have a plate shape, and that one surface thereof be a smooth surface. Moreover, it is preferable that the opposite surface with the one surface be an irregular surface having a plurality of irregularities. Herein, it is more preferable that surface roughness Ra of the irregular surface be 2 μm or more and 50 μm or less. By the fact that the surface roughness Ra of the irregular surface remains within this range, it becomes possible to further increase the extraction efficiency of the output light. Note that, in this description, the surface roughness Ra refers to arithmetic average roughness Ra defined in Japanese Industrial Standard JIS B 0601: 2013.

The surface roughness Ra of the smooth surface is not particularly limited, and is preferably a numerical value as approximate to zero as possible. The surface roughness Ra of the smooth surface can be set, for example, to less than 1 μm. Note that, though a lower limit of the surface roughness Ra of the smooth surface is not particularly limited, the lower limit can be set, for example, to 0.1 μm.

As described above, the wavelength converter 100 according to this embodiment includes: the first phosphor 1 composed of the inorganic phosphor activated by $Ce^{3+}$; and the second phosphor 2 composed of the inorganic phosphor activated by $Ce^{3+}$ and different from the first phosphor 1. At least one of the first phosphor 1 and the second phosphor 2 is particulate. The first phosphor 1 and the second phosphor 2 are bonded to each other by at least one of the chemical reaction in the contact portion between the compound that constitutes the first phosphor 1 and the compound that constitutes the second phosphor 2 and of the adhesion between the compound that constitutes the first phosphor 1 and the compound that constitutes the second phosphor 2. The wavelength converter 100 according to this embodiment includes a plurality of types of particulate phosphors which function as the light scattering bodies. Moreover, the wavelength converter 100 is composed of an inorganic compound excellent in thermal conductivity, and has the emission center that has ultrashort afterglow properties. Therefore, coherent light such as laser light, which has high directivity, can be absorbed by light scattering, and can be subjected to wavelength conversion into light that has a distribution approximate to the Lambertian distribution, in which glittered looking is suppressed. Moreover, it becomes possible to suppress a light output saturation and a temperature rise, which occur as the wavelength converter 100 is excited by high-density light. Therefore, the wavelength converter 100 becomes capable of obtaining high-output fluorescence while facilitating the color tone control.

[Method for Producing Wavelength Converter]

Next, a method for producing the wavelength converter 100 according to this embodiment will be described with reference to FIG. 7. Note that schematic diagrams located on the right side of FIG. 7 schematically illustrate states of phosphor particle groups in the respective steps.

Figure 7:
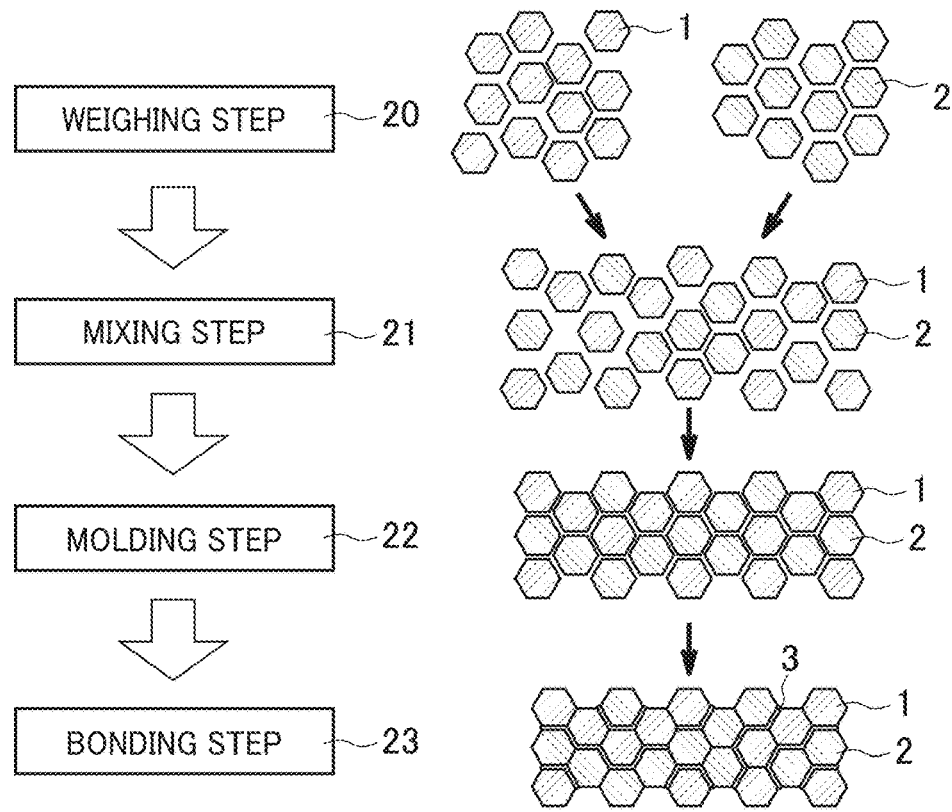
FIG. 7 is a schematic view for explaining a production process of the wavelength converter according to the embodiment of the present invention.

As illustrated in FIG. 7, the method for producing the wavelength converter according to this embodiment includes: a weighing step 20 of weighing a particle group of the first phosphor and a particle group of the second phosphor; and a mixing step 21 of mixing the weighed particle group of the first phosphor and the weighed particle group of the second phosphor. Moreover, such a production method as described above includes: a molding step 22 of fabricating a molded body formed by mixing the first phosphor and the second phosphor with each other; and a bonding step 23 of bonding the first phosphor and the second phosphor, which are included in the molded body, to each other. In the method for producing the wavelength converter according to this embodiment, a raw material for preparing the phosphor is not used, but the particle group of the phosphor inferior in reactivity to the raw material of the phosphor is used. Therefore, it becomes possible to easily obtain a wavelength converter that maintains fluorescence properties intrinsic to the first phosphor and the second phosphor.

The weighing step 20 is a step of weighing the first phosphor 1 and the second phosphor 2, in which a plurality of types of phosphor particle groups produced or acquired in advance are weighed. Thus, the plurality of types of phosphor particle groups weighed individually are prepared. Note that the weighing step 20 can be performed by using a conventional weighing method for use in the ceramic technology, the conventional weighing method including use of an automatic balance.

The mixing step 21 is a step of mixing the plurality of types of phosphor particle groups, which are weighed by the weighing step 20, with each other. That is, in the mixing step 21, the plurality of types of phosphor particle groups, which are weighed in advance, are mixed with each other. Thus, a mixed phosphor in which the plurality of types of phosphor particle groups are mixed with each other is prepared. Note that the mixing step 21 can adopt conventional dry mixing or wet mixing for use in the ceramic technology.

The molding step 22 is a step of forming a particle group of the mixed phosphor, which is obtained by the mixing step 21, into a molded body. That is, in the molding step 22, the particle group of the mixed phosphor is molded by being poured into a molding die or the like. Thus, the mixed phosphor turns to a molded body. Note that the molding step 22 can adopt a conventional molding technology for use in the ceramic technology, in which, for example, the particle group of the mixed phosphor is press-molded by using a metal mold and a press machine.

The bonding step 23 is a step of bonding the particles of the first phosphor and the particles of the second phosphor, which are brought into contact with each other in the molded body, to each other. Specifically, the above-mentioned molded body composed of the particle group of the first phosphor and the particle group of the second phosphor is heated, and so on, whereby the reaction between both of the particles is accelerated to bond both to each other. Thus, the particles of the first phosphor and the particles of the second phosphor are bonded to each other, and the wavelength converter of this embodiment can be obtained.

Note that the bonding step 23 can use a conventional firing technology for use in the ceramic technology. For example, the wavelength converter can be obtained by heating the molded body by using an electric furnace. As a heating temperature at this time, for example, a temperature lower than a melting point of the phosphor that is included in the molded body and has the highest melting point is set for heating the molded body. Thus, the particle groups of the phosphors which compose the molded body become capable of being bonded to each other to form the bonding portion 3.

It is preferable that the bonding step 23 be a step of forming the solid solution of the first phosphor 1 and the second phosphor 2 on the contact portion between the first phosphor 1 and the second phosphor 2. As mentioned above, in the wavelength converter 100, it is preferable that the first phosphor 1 and the second phosphor 2 be bonded to each other by the bonding portion 3 composed of the solid solution of these. Therefore, when the bonding step 23 is a step of forming the solid solution, the first phosphor 1 and the second phosphor 2 form such a structure of being bonded to each other while changing a composition thereof through intermediation of the solid solution of both thereof. Therefore, a wavelength converter can be obtained, in which bonding force between the particles of the first phosphor 1 and the particles of the second phosphor 2 is strong, and the different types of phosphor particles are difficult to separate from each other.

Moreover, as mentioned above, in the method for producing the wavelength converter according to this embodiment, not the raw material for preparing the phosphor itself but the particle group of the phosphor inferior in reactivity to the raw material of the phosphor is used. Therefore, in the bonding step 23, the particles of the first phosphor 1 and the particles of the second phosphor 2 are not completely solid-solved with each other, and the solid solution reaction advances in only the contact portion between the first phosphor 1 and the second phosphor 2. Therefore, in the obtained wavelength converter, the first phosphor and the second phosphor remain, and accordingly, it becomes possible to maintain the fluorescence properties intrinsic to these phosphors.

It is preferable that the bonding step 23 be a step of melting one of the first phosphor 1 and the second phosphor 2. Specifically, it is preferable that the above-mentioned molded body composed of the particle group of the first phosphor and the particle group of the second phosphor be heated at a temperature that is lower than the melting point of the phosphor that is included in the molded body and has the highest melting point and is higher than a melting point of the phosphor that is included in the molded body and has the lowest melting point. Thus, one of the first phosphor 1 and the second phosphor 2 is molten. Then, the molten phosphor that is one in the pair acts so as to wrap the other phosphor that maintains the particle shape thereof, and thereafter, coagulated by being cooled. Thus, the molten phosphor as one in the pair engages with the surface of the other phosphor and coagulates thereto, whereby the bonding portion 3 is formed. Therefore, it becomes possible to obtain the wavelength converter 100 in which the first phosphor 1 and the second phosphor 2 are strongly bonded to each other.

A method for forming the smooth surface on the wavelength converter 100 is not particularly limited, and a conventionally well-known polishing method can be used. For example, the surface of the wavelength converter 100 is polished by using sandpaper, grinder, shot blasting or the like, whereby the smooth surface can be formed.

As described above, the method for producing the wavelength converter includes the molding step of fabricating the molded body composed by mixing the particle group of the first phosphor 1 composed of the inorganic phosphor activated by $Ce^{3+}$ and the particle group of the second phosphor 2 composed of the inorganic phosphor activated by $Ce^{3+}$ and different from the first phosphor 1 with each other. This production method further includes the bonding step of bonding the first phosphor 1 and the second phosphor 2, which are included in the molded body, to each other. As described above, the method for producing the wavelength converter of this embodiment is extremely simple, and accordingly, becomes suitably usable for the industrial production of the wavelength converter.

[Light Emitting Device]

Next, a light emitting device according to this embodiment will be described. The light emitting device of this embodiment includes the above-mentioned wavelength converter.

The light emitting device of this embodiment widely includes electronic devices provided with functions to emit light, and is not particularly limited as long as is an electronic device that emits any kind of light. Moreover, the light emitting device also includes an illumination light source, an illuminator, a display device and the like. Therefore, an illuminator, a projector or the like, which is provided with a laser diode, is also regarded as a light emitting device.

The light emitting device of this embodiment is a device that uses at least the above-mentioned wavelength converter, and further uses, as output light, the fluorescence emitted by this wavelength converter. Specifically, the light emitting device of this embodiment combines the above-mentioned wavelength converter and an excitation source that excites the wavelength converter with each other. The wavelength converter acts as follows. The phosphors included in the wavelength converter absorb energy emitted by the excitation source, and convert the absorbed energy into fluorescence of which color tone is controlled.

Figure 8:
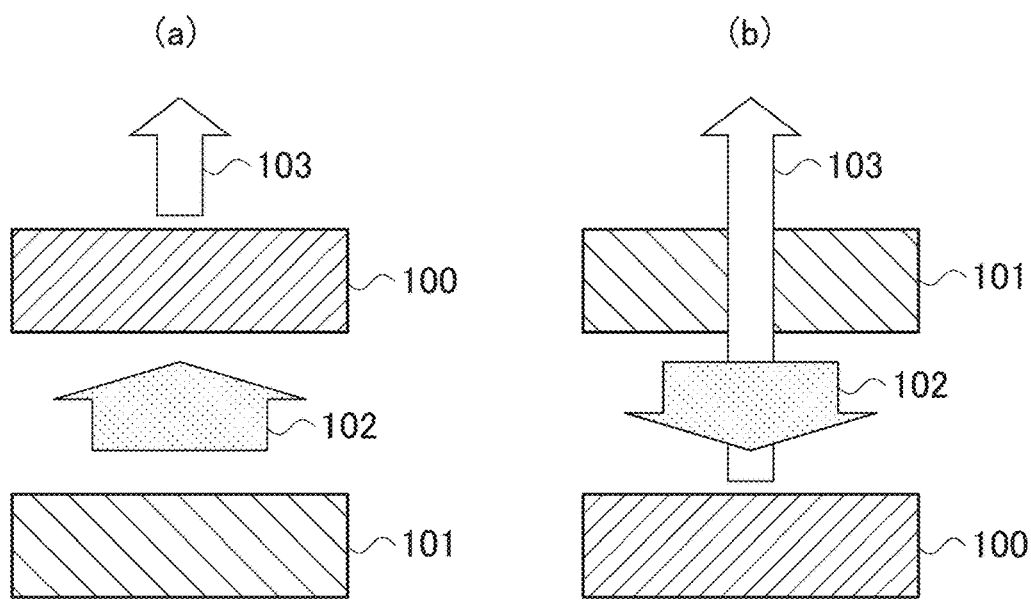
FIG. 8 is schematic views for explaining a light emitting device according to the embodiment of the present invention.

Hereinafter, the light emitting device of this embodiment will be described with reference to the drawings. FIG. 8 illustrates an outline of the light emitting device according to this embodiment. In FIG. 8(a) and FIG. 8(b), an excitation source 101 is a light source that generates excitation light 102 for exciting the phosphors provided in the wavelength converter 100 of this embodiment. As the excitation source 101, a radiation device can be used, which radiates a particle beam (an α ray, a β ray, an electron beam or the like) or an electromagnetic wave (a γ ray, an X ray, a vacuum ultraviolet ray, an ultraviolet ray, visible light or the like). Note that, as the excitation source 101, it is preferable to use a radiation device that radiates short wavelength visible light that is violet light.

As the excitation source 101, there can be used varieties of radiation generating devices, electron beam radiating devices, discharge light generating devices, solid-state light emitting elements, solid-state light emitting devices, and the like. Typical ones of the excitation source 101 include an electron gun, an X-ray tube, a rare gas discharge device, a mercury discharge device, a light emitting diode, a laser beam generating device including a semiconductor laser, an inorganic or organic electroluminescence element, and the like.

In FIG. 8(a) and FIG. 8(b), output light 103 is an excitation line emitted by the excitation source 101, or fluorescence emitted by the phosphors in the wavelength converter 100, which are excited by the excitation light 102. Then, the output light 103 is used as illumination light or display light in the light emitting device.

FIG. 8(a) illustrates a light emitting device that has a structure in which the output light 103 from the phosphors is emitted in a direction where the wavelength converter 100 is irradiated with the excitation line or the excitation light 102. Note that, as the light emitting device illustrated in FIG. 8(a), a fluorescent lamp, an electron tube and the like are mentioned as well as a white LED light source and a transmission-type laser illuminator. Meanwhile, FIG. 8(b) illustrates a light emitting device that has a structure in which the output light 103 from the wavelength converter 100 is emitted in a reverse direction to the direction where the wavelength converter 100 is irradiated with the excitation line or the excitation light 102. As the light emitting device illustrated in FIG. 8(b), there are mentioned reflection-type laser illuminators, for example, a light source device, a projector and the like, each of which uses a reflective plate-attached phosphor wheel.

Preferable ones as specific examples of the light emitting device of this embodiment are a semiconductor light emitting device, an illumination light source, an illuminator, a display device and the like, each of which uses the phosphors, and particularly, are laser illumination and a laser projector.

Then, it is preferable that the light emitting device of this embodiment further include the solid-state light emitting element, and that the first phosphor and the second phosphor, which are included in the wavelength converter, convert the excitation light emitted by the solid-state light emitting element into light having a longer wavelength than the excitation light. Moreover, it is preferable that the solid-state light emitting element emit the short wavelength visible light that is violet light. Use of the solid-state light emitting element as the excitation source makes it possible to achieve an all-solid-state light emitting device resistant to impact, for example, solid-state illumination. Note that the light emitting device as described above can be suitably used for any purpose of outdoor illumination, store illumination, a dimming system, facility illumination, ocean illumination, a projector, and an endoscope.

As described above, the light emitting device according to this embodiment includes the wavelength converter 100. Moreover, the light emitting device includes the wavelength converter that has ultrashort afterglow properties and includes the particulate phosphor functioning as a light scattering body. Therefore, the light emitting device becomes capable of emitting the output light in which the glittering looking due to the coherent effect intrinsic to the laser light is suppressed and orientation characteristics approximate to the Lambertian distribution are provided. Moreover, since the saturation of the light output is suppressed, the light emitting device can obtain high-output light emission even under a condition of being excited by high-density light.

The light emitting device of this embodiment includes the wavelength converter composed of the inorganic compound excellent in thermal conductivity. Therefore, heat of the wavelength converter, which is generated following the excitation by the high-density light, is radiated efficiently, and the temperature quenching of the phosphors is suppressed. Hence, in this light emitting device, it becomes possible to obtain high-output light.

It is preferable that the light emitting device of this embodiment further include the solid-state light emitting element that emits laser light, and that the first phosphor and the second phosphor, which are included in the wavelength converter, convert the laser light emitted by the solid-state light emitting element into light having a longer wavelength than the laser light. In this case, a laser diode can be used as the excitation source, and accordingly, a light emitting device usable as a high-output point light source can be obtained.

Note that, preferably, the output light emitted by the light emitting device is usable as illumination light or display pixels. Thus, a light emitting device usable as an illuminator or a display device can be obtained.

EXAMPLES

Hereinafter, this embodiment will be described more in detail by examples; however, this embodiment is not limited to these examples.

Example 1

In Example 1, a wavelength converter was fabricated, in which a $Lu_2CaMg_2(SiO_4)_3:Ce^{3+}$ phosphor was used as the first phosphor, and $Lu_3Al_2(AlO_4)_3:Ce^{3+}$ phosphor was used as the second phosphor.

Specifically, first, the $Lu_2CaMg_2(SiO_4)_3:Ce^{3+}$ phosphor and the $Lu_3Al_2(AlO_4)_3:Ce^{3+}$ phosphor were prepared. As $Lu_2CaMg_2(SiO_4)_3:Ce^{3+}$, one was used, which was prepared by thermally reacting mixed powder of a raw material of oxide ceramics and a compound functioning as a reaction accelerator at a temperature of 1300 to 1400° C. Moreover, a commercially available product was used as the $Lu_3Al_2(AlO_4)_3:Ce^{3+}$ phosphor.

Figure 9:
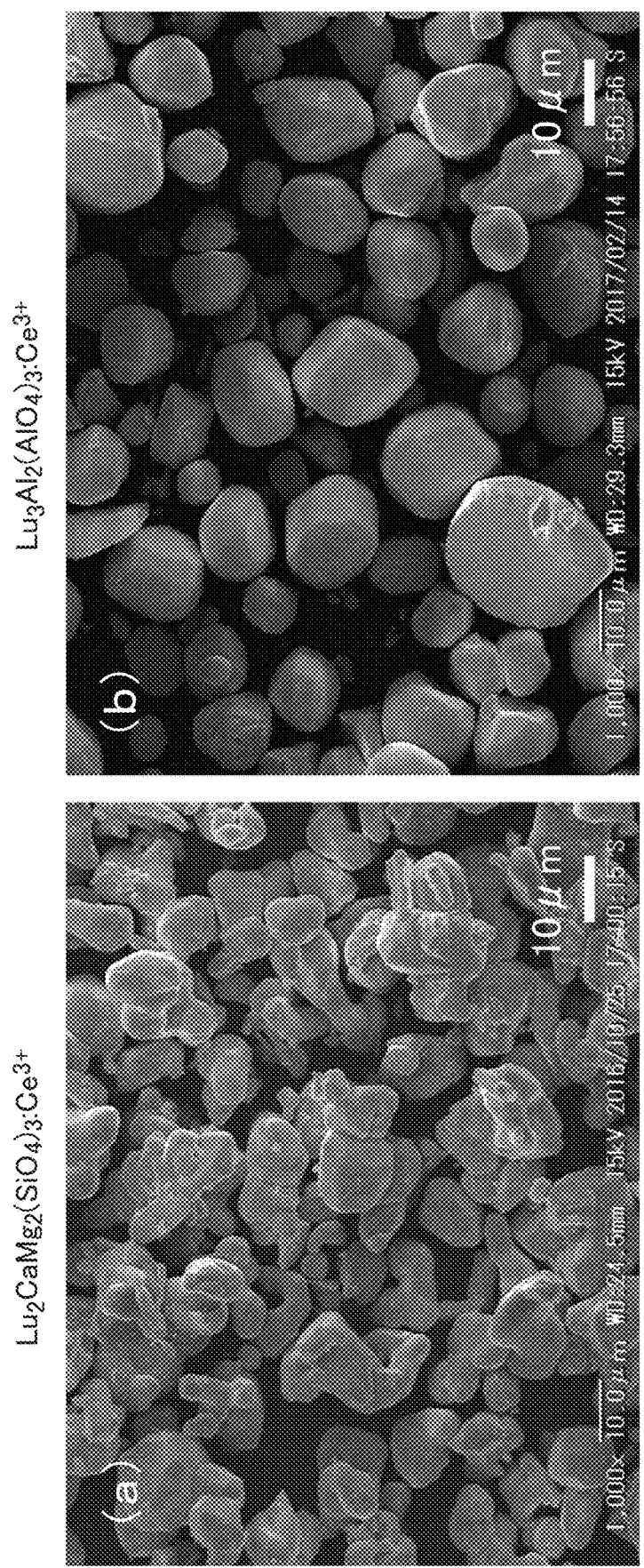
FIG. 9(a) is an electron micrograph showing a $Lu_2CaMg_2(SiO_4)_3:Ce^{3+}$ phosphor.
FIG. 9(b) is an electron micrograph showing a $Lu_3Al_2(AlO_4)_3:Ce^{3+}$ phosphor.

For reference, FIG. 9(a) shows an electron micrograph of the $Lu_2CaMg_2(SiO_4)_3:Ce^{3+}$ phosphor. FIG. 9(b) shows an electron micrograph of the $Lu_3Al_2(AlO_4)_3:Ce^{3+}$ phosphor. Moreover, Table 1 collectively shows characteristics of these phosphors. Note that each of average particle sizes shown in Table 1 is set to an average value of major axis lengths of fifty particles which are recognizable as primary particles and arbitrarily extracted from each of electron micrographs (magnification: 1000 times) shown in FIG. 9.

TABLE 1

|  | First phosphor | Second phosphor |
| --- | --- | --- |
| General formula | $Lu_2CaMg_2(SiO_4)_3:Ce^{3+}$ | $Lu_3Al_2(AlO_4)_3:Ce^{3+}$ |
| Composition | $(Lu_{0.97}Ce_{0.03})_2CaMg_2(SiO_4)_3$ | $(Lu_{0.98}Ce_{0.02})_3Al_2(AlO_4)_3$ X |
| Type | silicate | aluminate |
| Crystal structure | garnet type | garnet type |
| Average particle size | 11.5 μm | 13.2 μm |
| Fluorescence peak wavelength | 600 nm | 518 nm |
| Internal quantum efficiency (450 nm) | 72% | 96% |

TABLE 1-continued

|  | First phosphor | Second phosphor |
|---|---|---|
| Light absorptivity (450 nm) | 71% | 78% |

✕assumed composition

It is sufficient to prepare such phosphor powders as the raw materials of the wavelength converter in Example 1.

Next, mixed powder of the $Lu_2CaMg_2(SiO_4)_3$:$Ce^{3+}$ phosphor and the $Lu_3Al_2(AlO_4)_3$:$Ce^{3+}$ phosphor was prepared. Specifically, the $Lu_2CaMg_2(SiO_4)_3$:$Ce^{3+}$ phosphor and the $Lu_3Al_2(AlO_4)_3$:$Ce^{3+}$ phosphor were weighed so that a mass ratio thereof became 1:1, and thereafter were manually mixed with each other for approximately 10 minutes by using a mortar and a pestle, whereby mixed powder was prepared.

Then, a molded body composed of the above-described mixed powder was fabricated. Specifically, approximately 0.1 g of the mixed powder was poured into a heat press machine-oriented metal mold (made by As One Corporation) made of stainless steel with a diameter of 10 mm, and was pressed with a pressure of approximately 10 MPa. Thus, a disc-shaped molded body with a diameter of approximately 10 mm and a height of approximately 0.8 mm was obtained.

Finally, by using an atmosphere furnace, the above-described molded body was temporarily fired for 1 hour at a temperature of 1350° C. in an atmosphere in which a ratio of nitrogen is 96 vol % and a ratio of hydrogen is 4 vol %. Moreover, by using an atmosphere furnace filled with the atmosphere, the temporarily fired molded body was finally fired for 2 hours in the atmosphere at a temperature of 1500° C. Thus, a sintered body composed by bonding a plurality of types of the phosphor particles to each other was obtained. Note that any of heating rates and cooling rates in the temporal firing and the final firing was set to 400° C./hour.

In this way, a disc-shaped sintered body with a diameter of approximately 7.5 mm and a height of approximately 0.6 mm was obtained. Note that, when the obtained sintered body was visually observed, a color of the sintered body was light yellow orange, and the sintered body had translucency.

Moreover, when the sintered body was irradiated with blue light with a wavelength of 450 nm, reddish fluorescence was recognized from an irradiated surface. Moreover, when the sintered body was irradiated with an ultraviolet ray with a wavelength of 365 nm, yellowish fluorescence was recognized from the irradiated surface. Further, when the sintered body was irradiated with the blue light with a wavelength of 450 nm or the ultraviolet ray, reddish fluorescence was recognized also from a back surface of the irradiated surface. Note that the fluorescence recognized on the back surface of the irradiated surface had an intensity equivalent to that of the fluorescence recognized on the irradiated surface. Therefore, the obtained sintered body emitted fluorescence with substantially uniform intensity and color tone as a whole. From this, the wavelength converter of Example 1 can be said to be a good sintered body in terms of both transmittance and diffusibility of light.

Figure 10:
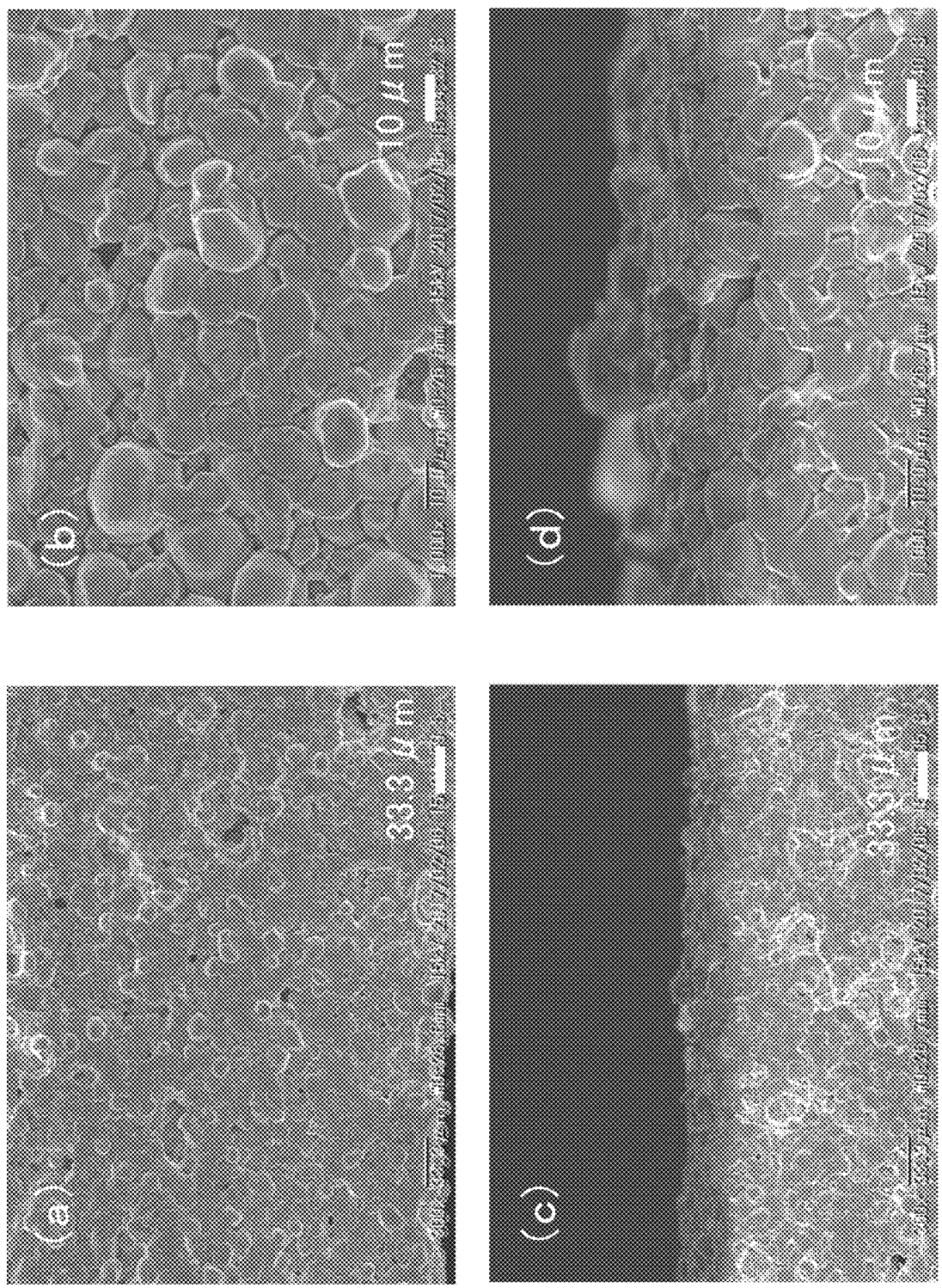
FIG. 10(a) is an electron micrograph showing a surface of a wavelength converter of Example 1.
FIG. 10(b) is an enlarged photograph of the surface shown in FIG. 10(a).
FIG. 10(c) is an electron micrograph showing a cross section of the wavelength converter of Example 1.
FIG. 10(d) is an enlarged photograph of the cross section shown in FIG. 10(c).
Figure 11:
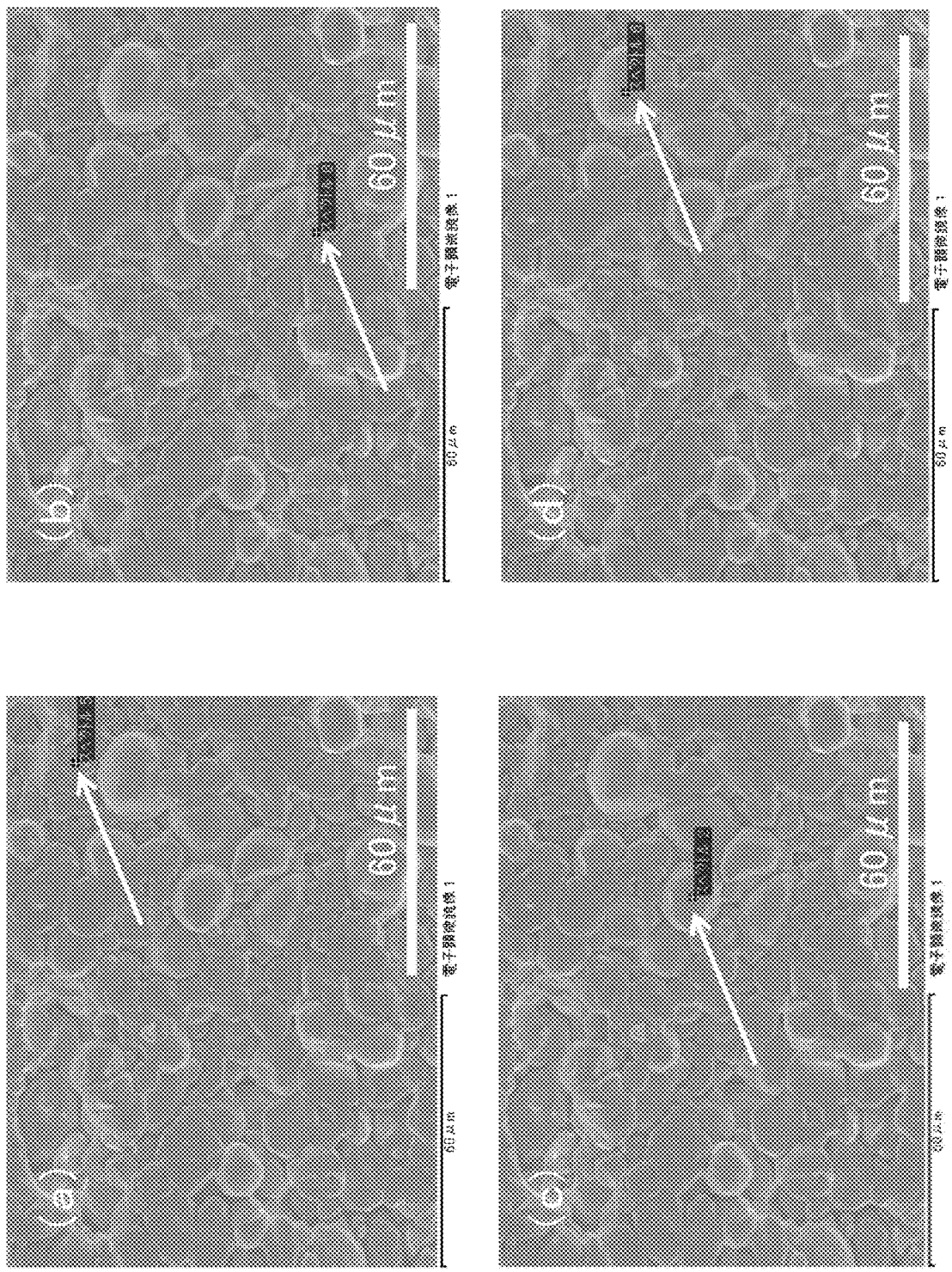
FIGS. 11(a) to 11(d) are electron micrographs showing the surface of the wavelength converter of Example 1.

FIG. 10(a) is an electron micrograph showing the surface of the wavelength converter of Example 1, and FIG. 10(b) is an enlarged photograph of the surface shown in FIG. 10(a). FIG. 10(c) is an electron micrograph showing a cross section of the wavelength converter of Example 1, and FIG. 10(d) is an enlarged photograph of the cross section shown in FIG. 10(c).

As seen in comparison between FIGS. 10(a) to 10(d) and FIGS. 9(a) and 9(b), in the wavelength converter of Example 1, the shape and size of the phosphor particles illustrated in FIGS. 9(a) and 9(b) were clearly recognized. Then, the wavelength converter of Example 1 was a sintered body that has a structure in which particles different in size connect to one another with an expansion on a point contact portion in a planar direction and thickness direction of the sintered body. Therefore, the particles of the phosphors are strongly bonded to each other, and a wavelength converter excellent in mechanical strength was formed.

Note that what is seen is that the wavelength converter has a structure having some air gaps, and forms a structural body having a light scattering effect by the air gaps.

FIGS. 11(a) to 11(d) are individually electron micrographs showing the surface of the wavelength converter of Example 1. Then, arrows illustrated in FIG. 11 indicate spots (totally four spots) subjected to composition analysis by energy dispersive X-ray spectrometry (EDX).

Although a detailed description is omitted, as a result of performing the composition analysis by the EDX, particles in which a primary particle size was relatively small, the particles being indicated by the arrows in FIG. 11(a) and FIG. 11(b), were a compound composed by containing $Lu_2CaMg_2(SiO_4)_3$ as a main component. Moreover, particles in which a primary particle size was relatively large, the particles being indicated by the arrows in FIG. 11(c) and FIG. 11(d), were a compound composed by containing $Lu_3Al_2(AlO_4)_3$ as a main component.

From this result, it was seen that the wavelength converter of Example 1 was a sintered body of a mixture of the $Lu_2CaMg_2(SiO_4)_3$:$Ce^{3+}$ phosphor and the $Lu_3Al_2(AlO_4)_3$:$Ce^{3+}$ phosphor, which were used as raw materials. Then, it was seen that, in the wavelength converter of Example 1, the $Lu_2CaMg_2(SiO_4)_3$:$Ce^{3+}$ phosphor and the $Lu_3Al_2(AlO_4)_3$:$Ce^{3+}$ phosphor, which were used as raw materials, were dispersed three-dimensionally without substantially changing the initial primary particle sizes thereof. Moreover, it was seen that both of the particles of these phosphors formed such a sintered body that has a structure in which the point contact portions connect to one another with an expansion.

As described above, the wavelength converter of Example 1 is a sintered body composed of the plurality of types of $Ce^{3+}$-activated phosphors. Then, at least the $Ce^{3+}$-activated phosphor containing $Lu_2CaMg_2(SiO_4)_3$ as a base material and the $Ce^{3+}$-activated phosphor containing $Lu_3Al_2(SiO_4)_3$ as a base material are combined with each other, whereby such a structure was achieved.

Figure 12:
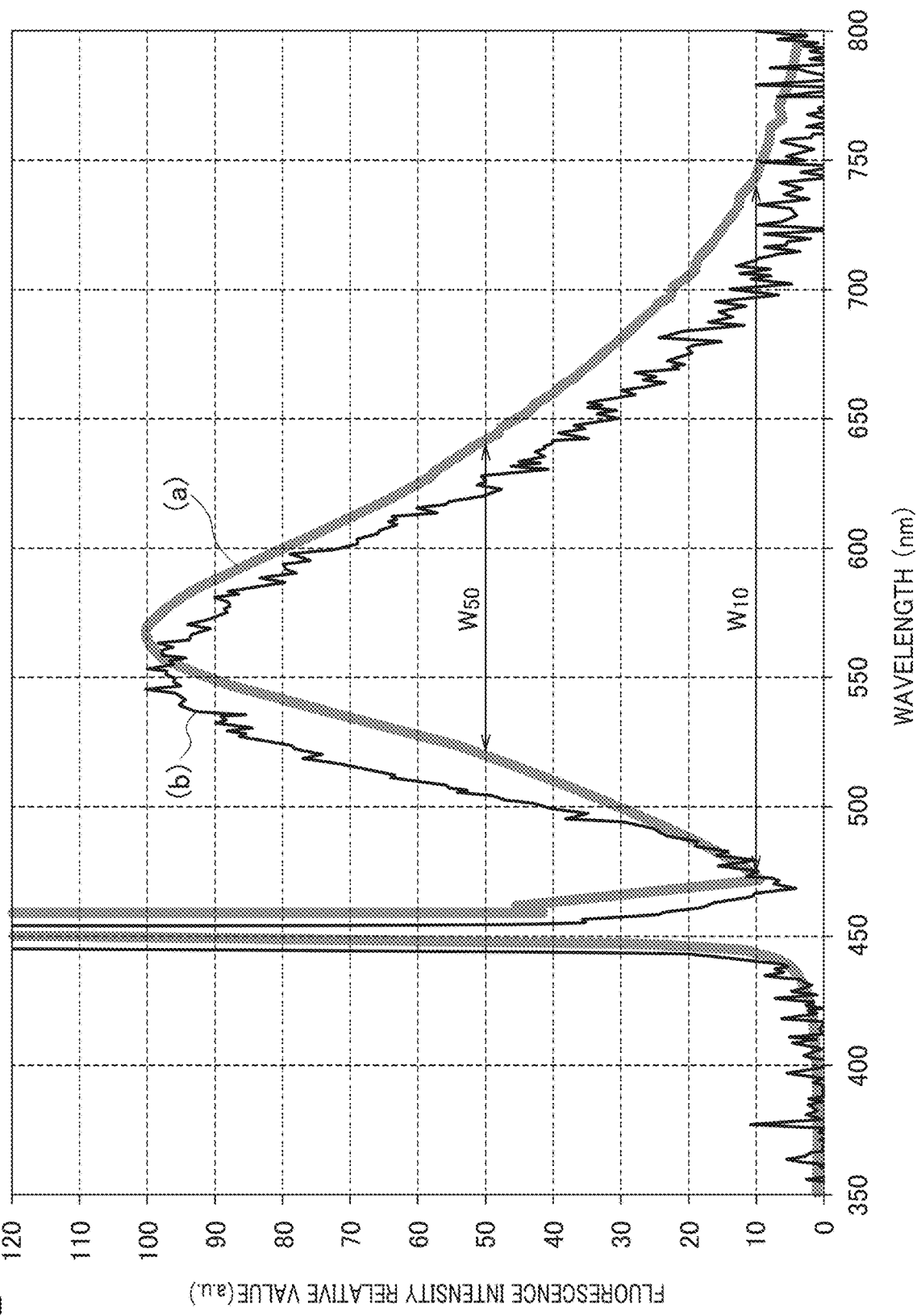
FIG. 12 is a graph showing results of measuring fluorescence spectra of the wavelength converter according to the embodiment of the present invention.

Next, a fluorescence spectrum when the wavelength converter of Example 1 was irradiated with a blue monochrome light was measured. (a) in FIG. 12 is a fluorescence spectrum when the wavelength converter of Example 1 was irradiated with blue monochrome light with a wavelength of 455 nm. Moreover, (b) in FIG. 12 is a fluorescence spectrum when a solid solution of $(Lu_{0.97}Ce_{0.03})_2CaMg_2(SiO_4)_3$ and $(Lu_{0.98}Ce_{0.02})_3Al_2(SiO_4)_3$ was irradiated with blue monochrome light with a wavelength of 450 nm. Note that this solid solution is a solid solution formed by solid-solving a first phosphor $((Lu_{0.97}Ce_{0.03})_2CaMg_2(SiO_4)_3)$ and a second phosphor $((Lu_{0.98}Ce_{0.02})_3Al_2(SiO_4)_3)$ in a molar ratio of 1:1. Then, a composition of this solid solution is $Lu_{2.5}Ca_{0.5}MgAl(SiO_4)_{1.5}(AlO_4)_{1.5}$:$Ce^{3+}$.

Figure 13:
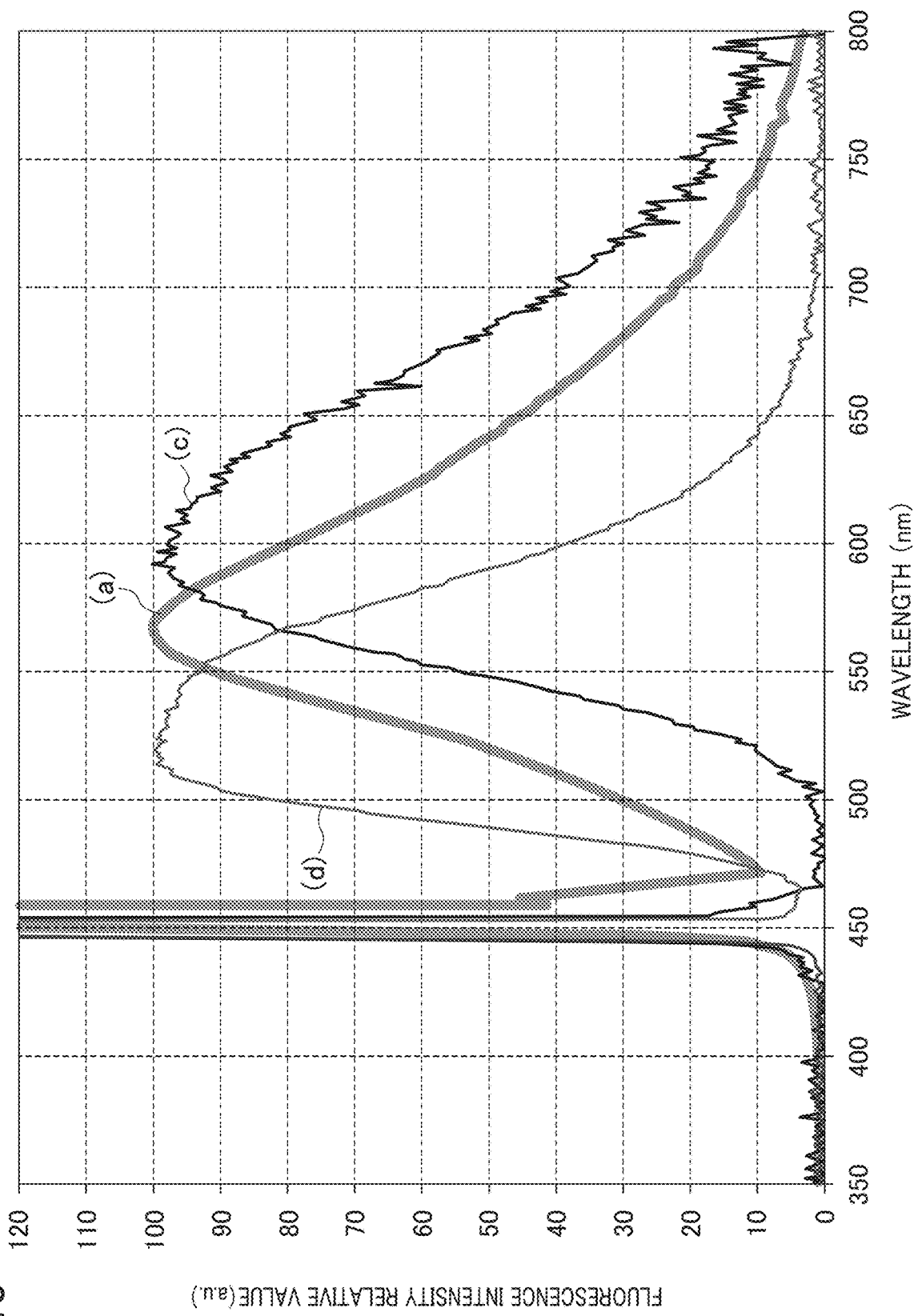
FIG. 13 is a graph showing a result of measuring the fluorescence spectrum of the wavelength converter according to the embodiment of the present invention.

For reference, FIG. 13 illustrates a fluorescence spectrum ((c) in FIG. 13) when the first phosphor $((Lu_{0.97}Ce_{0.03})_2CaMg_2(SiO_4)_3)$ was irradiated with the blue monochrome light with a wavelength of 450 nm together with the fluorescence spectrum ((a) in FIG. 13) of the wavelength converter. Moreover, FIG. 13 also illustrates a fluorescence spectrum ((d) in FIG. 13) when the second phosphor ($(Lu_{0.98}Ce_{0.02})_3Al_2(SiO_4)_3$) was irradiated with the blue monochrome light with a wavelength of 450 nm.

As seen from comparison between (a) and (b) in FIG. 12, the fluorescence spectrum of the wavelength converter 1 in Example 1, which is illustrated by (a) in FIG. 12, had a shape different from that of the fluorescence spectrum of the solid solution, which is illustrated by (b) in FIG. 12. Specifically, in the fluorescence spectrum of the wavelength converter of Example 1, a fluorescence peak wavelength thereof was located at a vicinity of 566 nm (within a wavelength range of more than 555 nm and less than 575 nm). Then, when a fluorescence spectrum width at an intensity level of x % with respect to the peak intensity of the fluorescence spectrum was defined as an x % width of the fluorescence spectrum, a 10% width of the fluorescence spectrum in the wavelength converter of Example 1 was approximately 270 nm (more than 250 nm and less than 290 nm). Moreover, a 50% width of the fluorescence spectrum was approximately 121 nm (more than 115 nm and less than 124 nm). Note that, in FIG. 12, the 10% width of the fluorescence spectrum is denoted by $W_{10}$, and the 50% width of the fluorescence spectrum is denoted by $W_{50}$. Moreover, the 50% width of the fluorescence spectrum is a so-called full width at half maximum.

In contrast, in the fluorescence spectrum of the solid solution, which is indicated by (b) in FIG. 12, a fluorescence peak wavelength thereof was located at a vicinity of 550 nm. Then, a 10% width of the fluorescence spectrum of the solid solution was approximately 220 nm, and a 50% width of the fluorescence spectrum thereof was 124 nm.

As described above, in comparison with the solid solution, in the wavelength converter of Example 1, the peak wavelength of the fluorescence spectrum is long, the 10% width of the fluorescence spectrum is wide, and the 50% width of the fluorescence spectrum is narrow. That is, the wavelength converter of Example 1 was one that emitted fluorescence having a special spectrum shape that has a wide base and is suddenly narrowed as approaching a vertex thereof. Due to such a shape, as seen from FIG. 12, the wavelength converter of Example 1 is provided with an advantageous effect as for use in illumination, the effect being of emitting light in which a ratio of a red light component is high in comparison with the solid solution.

As seen from comparison between (b) in FIG. 12, (c) and (d) in FIG. 13 and (a) in FIG. 12, the fluorescence spectrum shape of the fluorescence emitted by the wavelength converter of Example 1 is a peculiar shape different from general $Ce^{3+}$-activated phosphors. That is, the fluorescence spectrum shape of the $Ce^{3+}$-activated phosphor becomes a left-right asymmetric shape that has a shoulder on a long wavelength side of the fluorescence peak due to a light emission mechanism, and meanwhile, the wavelength converter of Example 1 has a shape close to a left-right symmetric shape.

Figure 14:
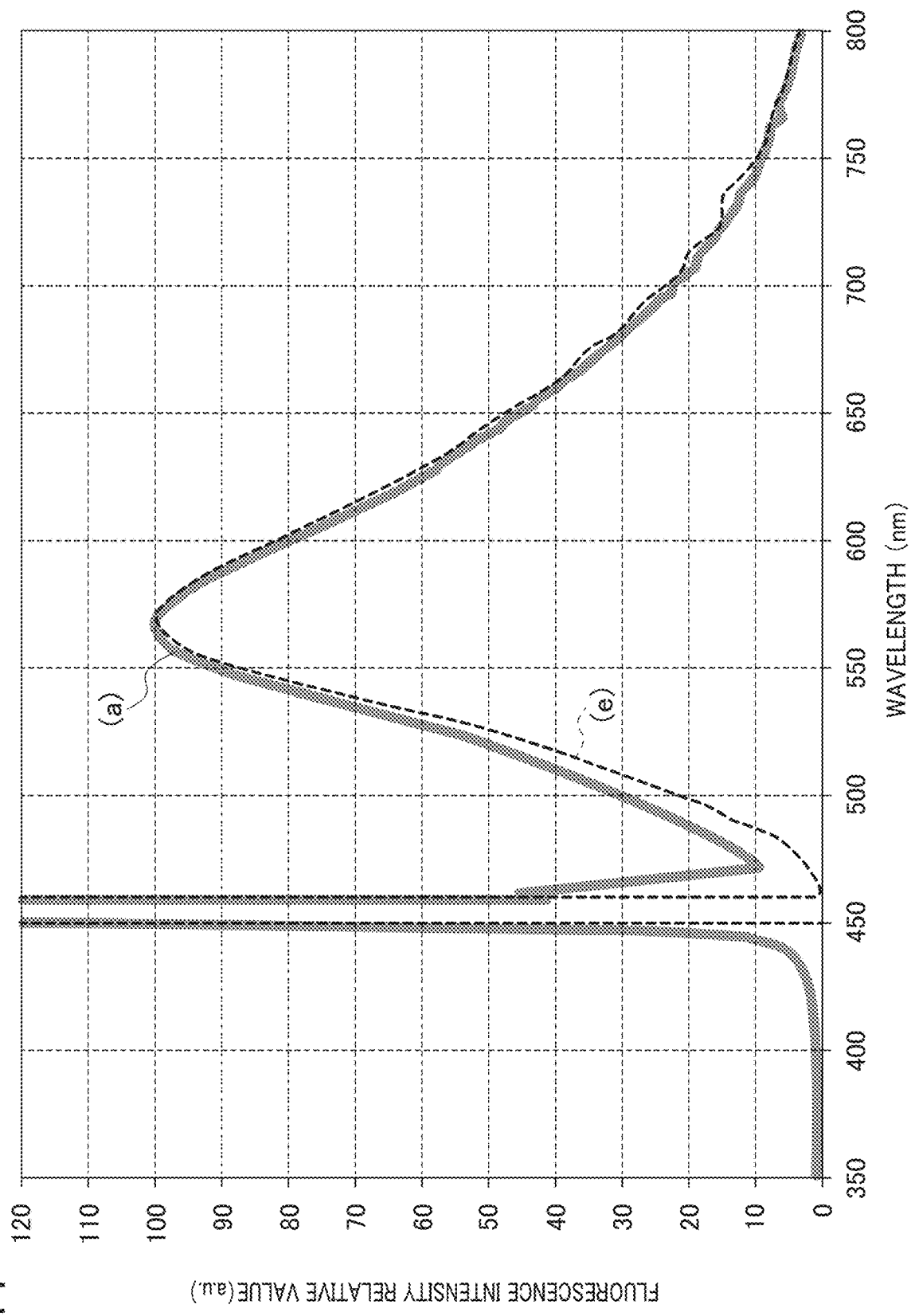
FIG. 14 is a graph showing the fluorescence spectrum of the wavelength converter of Example 1 and a simulation result of a fluorescence spectrum emitted by a mixed phosphor of $Lu_2CaMg_2(SiO_4)_3:Ce^{3+}$ and $Lu_3Al_2(AlO_4)_3:Ce^{3+}$.

FIG. 14 collectively shows the fluorescence spectrum of the wavelength converter of Example 1 and a simulation result of a fluorescence spectrum emitted by a mixed phosphor of $Lu_2CaMg_2(SiO_4)_3:Ce^{3+}$ and $Lu_3Al_2(AlO_4)_3:Ce^{3+}$. (a) in FIG. 14 is the fluorescence spectrum of the wavelength converter of Example 1, and (e) in FIG. 14 is the simulation result. Note that a simulation herein is made on the premise that each wavelength component of the fluorescence spectrum of $Lu_3Al_2(AlO_4)_3:Ce^{3+}$ is entirely affected by light absorption characteristics of $Lu_2CaMg_2(SiO_4)_3:Ce^{3+}$ in a wavelength range of 400 nm or more and 650 nm or less.

As seen from FIG. 14, the fluorescence spectrum of the wavelength converter of Example 1 substantially coincided with the simulation result of the fluorescence emitted by the mixed phosphor of $Lu_2CaMg_2(SiO_4)_3:Ce^{3+}$ and $Lu_3Al_2(AlO_4)_3:Ce^{3+}$.

From the results shown in FIG. 12 to FIG. 14, it is seen that the wavelength converter of Example 1 is the sintered body of the mixture of the $Lu_2CaMg_2(SiO_4)_3:Ce^{3+}$ phosphor and the $Lu_3Al_2(AlO_4)_3:Ce^{3+}$ phosphor, which were used as raw materials.

Example 2

In Example 2, a smooth surface was formed on the wavelength converter composed of the disc-shaped sintered body with a diameter of approximately 7.5 mm and a height of approximately 0.6 mm, the wavelength converter having been obtained in Example 1.

Specifically, first, one main surface of the wavelength converter in Example 1 was roughly polished by using a diamond file (#180). Next, the roughly polished surface was mechanically polished by using diamond power with a size of 0.25 µm. In this way, a wavelength converter of Example 2, which had a smooth surface, was obtained.

Figure 15:
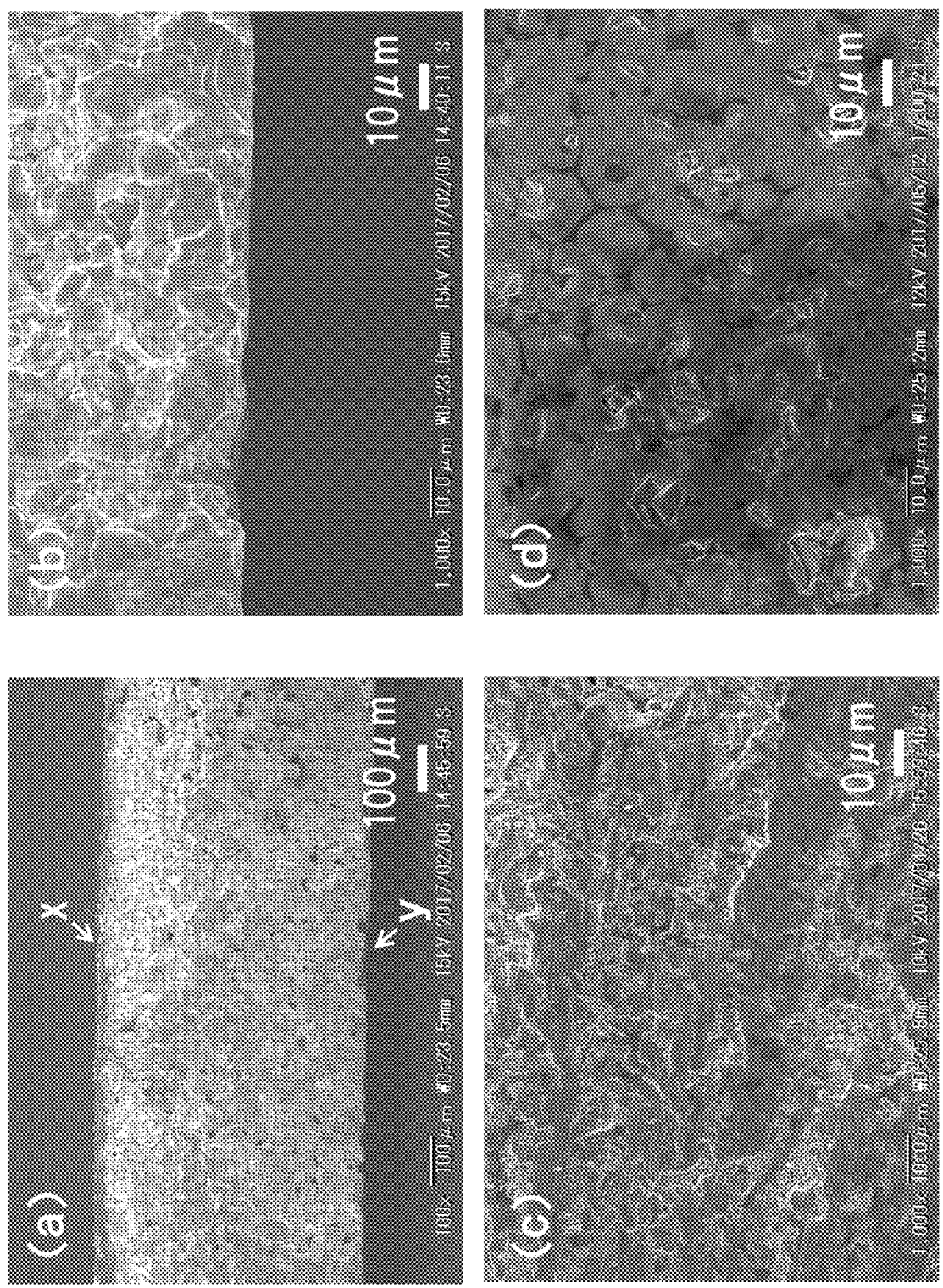
FIG. 15 are electron micrographs showing states where one surface in the wavelength converter of Example 2 is polished.

FIG. 15 shows electron micrographs showing states where the wavelength converter of Example 2 was polished. (a) of FIG. 15 shows a cross section of the wavelength converter of Example 1 after the wavelength converter was roughly polished, and (b) of FIG. 15 enlargedly shows a roughly polished region. (c) of FIG. 15 shows the roughly polished surface of the wavelength converter, and (d) of FIG. 15 shows a mechanically polished surface of the wavelength converter.

As seen from (a) and (b) of FIG. 15, an unpolished surface x in Example 2 has irregularities, and meanwhile, a polished surface y is flat. Moreover, as seen from (c) and (d) of FIG. 15, polishing traces are observed on the polished surfaces of Example 2. That is, on the roughly polished surface shown in (c) of FIG. 15, polishing traces like flowing in one direction are recognized. Meanwhile, on the mechanically polished surface shown in (d) of FIG. 15, a state where single crystal phosphor particles themselves are polished is recognized.

As described above, the wavelength converter of Example 1 is polished to form a smooth surface, whereby the wavelength converter in which at least the polishing traces are recognized can be fabricated. Then, such a smooth surface acts to increase the incidence efficiency of the excitation light to the wavelength converter. Therefore, use of this wavelength converter makes it possible to obtain a high-output light emitting device.

Although this embodiment has been described above by the examples, this embodiment is not limited to these, and various modifications are possible within the scope of the spirit of this embodiment.

The entire contents of Japanese Patent Application No. 2017-111512 (filed on: Jun. 6, 2017) and Japanese Patent Application No. 2017-238640 (filed on: Dec. 13, 2017) are incorporated herein by reference.

INDUSTRIAL APPLICABILITY

In accordance with the present invention, there can be provided the wavelength converter capable of obtaining high-output fluorescence while making it easy to control the color tone, the method for producing the wavelength converter, and the light emitting device using the wavelength converter.

REFERENCE SIGNS LIST

1 First phosphor
2 Second phosphor
3 Bonding portion
22 Molding step
23 Bonding step
100, 100A, 100B, 100C Wavelength converter

The invention claimed is:

1. A wavelength converter comprising:
   a first phosphor composed of an inorganic phosphor activated by $Ce^{3+}$;
   a second phosphor composed of an inorganic phosphor activated by $Ce^{3+}$ and different from the first phosphor;
   wherein at least one of the first phosphor and the second phosphor is particulate,
   the wavelength converter is a sintered body that is composed in such a manner that the first phosphor and the second phosphor are sintered to each other, and has a plurality of air gaps in an inside of the sintered body,
   the first phosphor and the second phosphor are bonded to each other through a bonding portion, which is formed in such a manner that the compound that constitutes the first phosphor and the compound that constitutes the second phosphor are solid-solved with each other; and
   an average particle size of the particulate phosphor is 1 μm or more and less than 100 μm.

2. The wavelength converter according to claim 1, wherein the first phosphor emits fluorescence different in color from fluorescence of the second phosphor.

3. The wavelength converter according to claim 1, wherein melting points of the first phosphor and the second phosphor are different from each other.

4. The wavelength converter according to claim 1, wherein one of the first phosphor and the second phosphor is a silicate-based phosphor, and the other of the first phosphor and the second phosphor is an aluminate-based phosphor.

5. The wavelength converter according to claim 1, wherein the wavelength converter includes only elements that constitutes the first phosphor and elements that constitutes the second phosphor.

6. The wavelength converter according to claim 1, wherein the wavelength converter consists of inorganic oxides.

7. The wavelength converter according to claim 6, wherein the wavelength converter consists of garnet compounds.

8. The wavelength converter according to claim 1, wherein an emission center included in the wavelength converter is only $Ce^{3+}$.

9. The wavelength converter according to claim 1, wherein either one of the first phosphor and the second phosphor is a phosphor that emits light having a fluorescence peak within a wavelength range of 580 nm or more and less than 630 nm.

10. The wavelength converter according to claim 9, wherein the other of the first phosphor and the second phosphor is a phosphor that emits light having a fluorescence peak within a wavelength range of 480 nm or more and less than 550 nm.

11. The wavelength converter according to claim 1, wherein the first phosphor and the second phosphor are excited by light having a peak within a wavelength range of 400 nm or more and less than 470 nm.

12. The wavelength converter according to claim 1, wherein the fluorescence emitted by one of the first phosphor and the second phosphor excites the other of the first phosphor and the second phosphor.

13. The wavelength converter according to claim 1, wherein the wavelength converter has translucency.

14. The wavelength converter according to claim 1, wherein the wavelength converter does not have translucency.

15. The wavelength converter according to claim 1, wherein the wavelength converter has a plate shape, in which one surface is a smooth surface.

16. The wavelength converter according to claim 15, wherein an opposite surface with the one surface is an irregular surface having a plurality of irregularities, and
   surface roughness Ra of the irregular surface is 2 μm or more and 50 μm or less.

17. A light emitting device comprising the wavelength converter according to claim 1.

* * * * *